United States Patent
Kijima et al.

(10) Patent No.: US 6,524,728 B1
(45) Date of Patent: Feb. 25, 2003

(54) ORGANIC ELECTROLUMINESCENT DEVICE

(75) Inventors: Yasunori Kijima, Tokyo (JP); Tetsuo Shibanuma, Kanagawa (JP); Nobutoshi Asai, Kanagawa (JP); Shinichiro Tamura, Kanagawa (JP)

(73) Assignee: Sony Corporation, Tokyo (JP)

( * ) Notice: Subject to any disclaimer, the term of this patent is extended or adjusted under 35 U.S.C. 154(b) by 19 days.

(21) Appl. No.: 09/705,192

(22) Filed: Nov. 2, 2000

(30) Foreign Application Priority Data

Nov. 2, 1999 (JP) .............................. 11-312070

(51) Int. Cl.$^7$ ............................... H05B 33/00
(52) U.S. Cl. ................ 428/690; 428/212; 428/917; 313/502; 313/506
(58) Field of Search ................. 428/690, 917, 428/212; 313/502, 506

(56) References Cited

U.S. PATENT DOCUMENTS

| | | | | |
|---|---|---|---|---|
| 5,393,614 A | * | 2/1995 | Nakada | 428/690 |
| 6,010,796 A | * | 1/2000 | Kijima | 428/690 |
| 6,310,360 B1 | * | 10/2001 | Forrest et al. | 257/40 |
| 6,312,836 B1 | * | 11/2001 | Bulovic et al. | 428/690 |

FOREIGN PATENT DOCUMENTS

EP 0564224 A3 * 10/1993

* cited by examiner

Primary Examiner—Cynthia H. Kelly
Assistant Examiner—Dawn Garrett
(74) Attorney, Agent, or Firm—Sonnenschein, Nath & Rosenthal

(57) ABSTRACT

An organic electroluminescent device has a single hetero structure comprising, on a glass substrate, an ITO transparent electrode, a hole transport layer, an electron transport layer and a metal electrode superposed in this order wherein a hole-blocking layer containing a bathophenanthroline derivative of the following general formula is interposed between the hole transport layer and the electron transport layer. In this way, the electron-hole-re-combination in the hole transporting luminescent layer can be promoted. General Formula of Bathophenanthoroline Derivative:

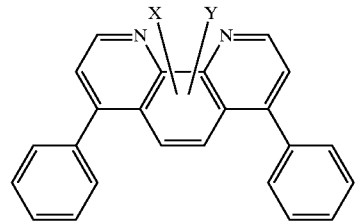

wherein X and Y may be the same or different and independently represent a hydrogen atom except the case where a hydrogen atom is at the 2 or 9 position, a substituted or unsubstituted alkyl group except the case where a methyl group is at the 2 or 9 position, a substituted or unsubstituted cycloalkyl group, a substituted or unsubstituted aryl group, a substituted or unsubstituted amino group, a halogen atom, a nitro group, a cyano group or a hydroxyl group provided that at least one of these groups is contained at an arbitrary position.

7 Claims, 9 Drawing Sheets

GENERAL FORMULA OF BATHOPHENANTHOROLINE DERIVATIVE:

STRUCTURAL FORMULA 1
(COMPOUND NO. 28):

STRUCTURAL FORMULA 2
(COMPOUND NO. 29):

STRUCTURAL FORMULA 3
(COMPOUND NO. 32):

STRUCTURAL FORMULA OF m-MTDATA

STRUCTURAL FORMULA OF
α-NAPHTHYLPHENYLDIAMINE
(α-NPD)

STRUCTURAL FORMULA OF $Alq_3$

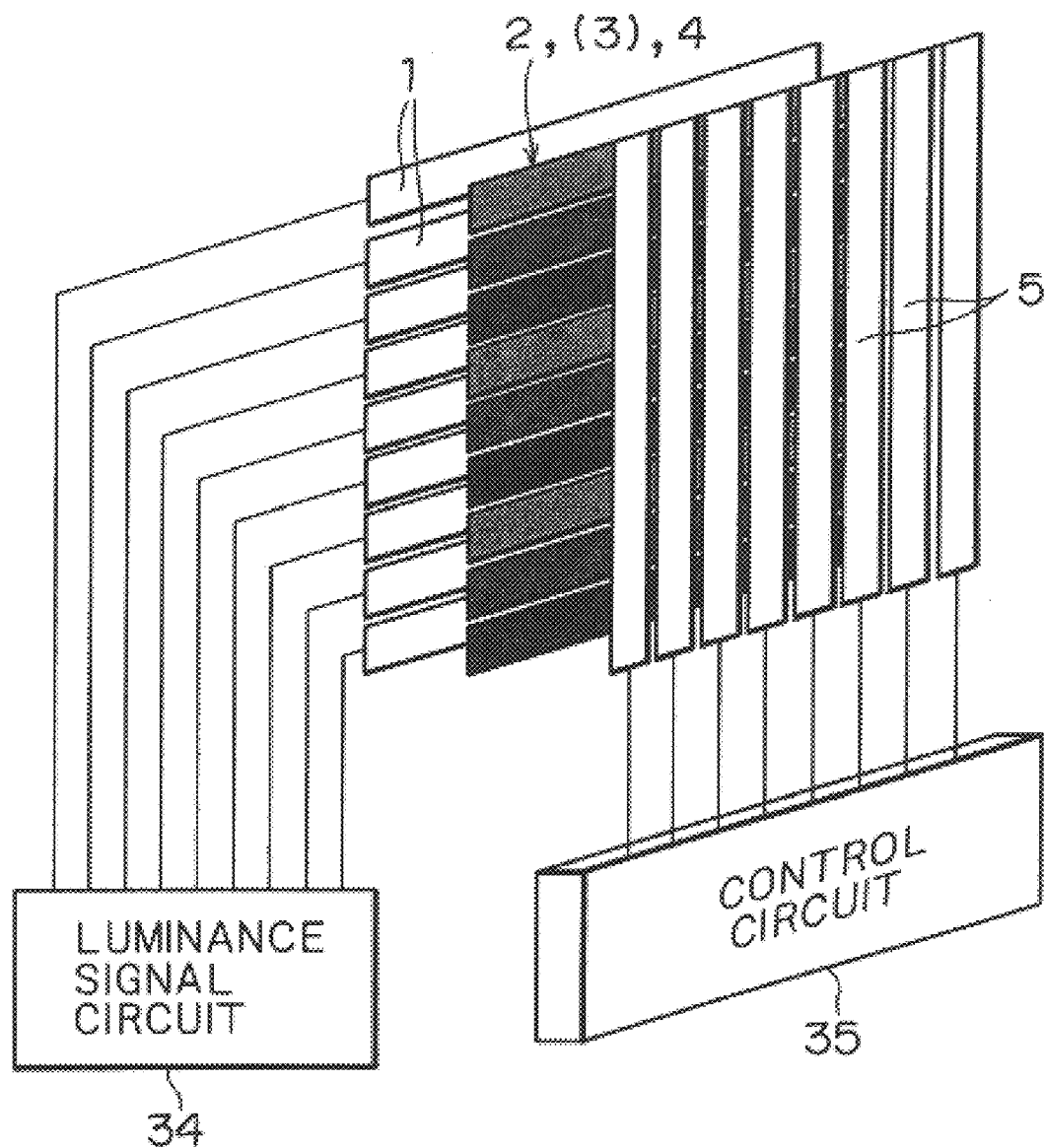

ORGANIC ELECTROLUMINESCENT DEVICE

RELATED APPLICATION DATA

The present application claims priority to Japanese Application No. P11-312070 filed Nov. 2, 1999, which application is incorporated herein by reference to the extent permitted by law.

BACKGROUND OF THE INVENTION

This invention relates to an organic electroluminescent device, which is adapted for use as a display device or a light-emitting device such as a spontaneous light flat display, especially an organic electroluminescent color display using an organic thin film as an electroluminescent layer.

In recent years, importance of interfaces between human beings and machines including multimedia-oriented commercial articles is exalted. For more comfortable and more efficient machine operations, it is necessary to retrieve information from an operated machine without failure simply, instantaneously and in an adequate amount. To this end, studies have been made on various types of display devices or displays.

As machines are now miniaturized, there is an increasing demand, day by day, for miniaturization and thinning of display devices. For instance, there is an inconceivable development with respect to the miniaturization of lap top-type information processors of the all-in-one type such as notebook-size personal computers, notebook-size word processors and the like. This, in turn, entails a remarkable technical innovation on liquid crystal displays for use as a display device for the processor.

Nowadays, liquid crystal displays are employed as an interface of a diversity of articles and have wide utility in the fields not only of lap top-type information processors, but also of articles for our daily use including small-sized television sets, watches, desk-top calculators and the like.

These liquid crystal displays have been studied as a key of display devices, which are used as the interface connecting a human being and a machine and cover small-sized to large capacitance display devices while making use of the feature that liquid crystals are low in drive voltage and power consumption. However, liquid crystal displays have the problems that they do not rely on spontaneous light and thus need a greater power consumption for back light drive than for liquid crystal drive, with the result that a service time is shortened when using a built-in battery, thus placing a limitation on their use. Moreover, the liquid crystal display has another problem that it has such a narrow angle of field as not to be suitable for use as a large-sized display device.

Furthermore, the liquid crystal display depends on the manner of display using the orientation of liquid crystal molecules, and this is considered to bring about a serious problem that its contrast changes depending on the angle even within an angle of field.

From the standpoint of drive systems, an active matrix system, which is one of drive systems, has a response speed sufficient to deal with a motion picture. However, since a TFT (thin film transistor) drive circuit is used, a difficulty is involved in making a large screen size owing to the pixel defects, thus being disadvantageous in view of the reduction in cost.

In the liquid crystal display, a simple matrix system, which is another type of drive system, is not only low in cost, but also relatively easy in making a large screen size. However, this system has the problem that its response speed is not enough to deal with a motion picture.

In contrast, a spontaneous light display device is now under study such as on a plasma display device, an inorganic electroluminescent device, an organic electroluminescent device and the like.

The plasma display device employs plasma emission in a low pressure gas for display and is suited for the purposes of a large size and large capacitance, but has the problem on thinning and costs. In addition, an AC bias of high potential is required for its drive, and thus, the display is not suitable as a portable device.

The inorganic electroluminescent device has been put on the market as a green light emission display. Like the plasma display device, an AC bias drive is essential, for which several hundreds of volts are necessary, thus not being of practical use.

In this connection, however, emission of three primaries including red (R), green (G) and blue (B) necessary for color display has been succeeded due to the technical development. Since inorganic materials are used for this purpose, it has been difficult to control emission wavelengths depending on the molecular design or the like. Thus, it is believed that full color display is difficult.

On the other hand, the electroluminescent phenomenon caused by organic compounds has been long studied ever since there was discovered a luminescent or emission phenomenon wherein carriers are injected into the single crystal of anthracene capable of emitting a strong fluorescence in the first part of 1960s. However, such fluorescence is low in brightness and monochronous in nature, and the single crystal is used, so that this emission has been made as a fundamental investigation of carrier injection into organic materials.

However, since Tang et al. of Eastman Kodak have made public an organic thin film electroluminescent device of a built-up structure having an amorphous luminescent layer capable of realizing low voltage drive and high brightness emission in 1987, extensive studies have been made, in various fields, on the emission, stability, rise in brightness, built-up structure, manner of fabrication and the like with respect to the three primaries of R, G and B.

Furthermore, diverse novel materials have been prepared with the aid of the molecular design inherent to an organic material. At present, it starts to conduct extensive studies on applications, to color displays, of organic electroluminescent devices having excellent characteristic features of DC low voltage drive, thinning, and spontaneous light emission and the like.

The organic electroluminescent device (which may be sometimes referred to as organic EL device hereinafter) has a film thickness of 1 μm or below. When an electric current is charged to the device, the electric energy is converted to a light energy thereby causing luminescence to be emitted in the form of a plane. Thus, the device has an ideal feature for use as a display device of the spontaneous emission type.

FIG. 14 shows an example of a known organic EL device. An organic EL device 10 includes, on a transparent substrate 6 (e.g. a glass substrate), an ITO (indium tin oxide) transparent electrode 5, a hole transport layer 4, a luminescent layer 3, an electron transport layer 2, and a cathode 1 (e.g. an aluminium electrode) formed in this order, for example, by a vacuum deposition method.

A DC voltage 7 is selectively applied between the transparent electrode 5 serving as an anode and the cathode 1, so that holes serving as carriers charged from the transparent electrode 5 are moved via the hole transport layer 4, and electrons charged from the cathode 1 are moved via the electron transport layer 2, thereby causing the re-combination of the electrons-holes. From the site of the re-combination, light 8 with a given wavelength is emitted and can be observed from the side of the transparent substrate 6.

The luminescent layer 3 may be made of a light-emitting substance such as, for example, anthracene, naphthalene, phenanthrene, pyrene, chrysene, perylene, butadiene, coumarin, acridine, stilbene and the like. This may be contained in the electron transport layer 2.

FIG. 15 shows another example of an organic EL device. In an organic EL device 20, the luminescent layer 3 is omitted and, instead, such a light-emitting substance as mentioned above is contained in the electron transport layer 2, and thus, the organic EL device 20 is so arranged as to emit light 18 having a given wavelength from an interface between the electron transport layer 2 and the hole transport layer 4.

FIG. 16 shows an application of the organic EL device. More particularly, a built-up body of the respective organic layers (including the hole transport layer 4, and the luminescent layer 3 or the electron transport layer 2) is interposed between the cathode 1 and the anode 5. These electrodes are, respectively, provided in the form of stripes that are intersected in the form of a matrix. In this state, a signal voltage is applied to in time series by means of a luminance signal circuit 34 and a shift register-built in control circuit 35 so that light is emitted at a number of intersected points (pixels), respectively.

Such an arrangement as set out above is usable not only as a display, but also as an image reproducing apparatus. It will be noted that if the striped pattern is provided for the respective colors of R, G and B, there can be obtained a full color or a multi-color arrangement.

In a display device made of a plurality of pixels using the organic EL device, emitting organic thin film layers 2, 3 and 4 are usually sandwiched between the transparent electrode 5 and the metal electrode 1, and emission occurs at the side of the transparent electrode 5.

The organic EL device set out above still has problems to solve. For instance, upon application of the organic EL device to a color display, it is essentially required to stably emit primaries of R, G and B. At the present stage, however, there have never been reported, except green light emitting materials, red and blue materials that have stability, chromaticity, brightness and the like enough to apply to displays.

Especially, with respect to blue emission of good chromaticity, it has now been difficult to obtain stable emission owing to the generation of heat from the course of a thermal relaxation procedure involving light emission and the presence of singlet oxygen or the like.

Moreover, where a dye of high crystallinity is used, an oligomer is produced upon solidification. This leads to a longer emission wavelength, with the high possibility that there occurs a phenomenon where even if emission takes place, it ceases immediately.

Many studies have been made on the development of a novel blue light-emitting material. Along with the study and development of a novel substance, it is important to obtain stable emission by application of existing materials. Additionally, the use of a material that has been established to some extent from the standpoint of its behavior contributes greatly to the shortage of time in the study and development, thus indicating an index to the development of materials.

For instance, a coumarin-based laser dye with a high fluorescent yield can be applied to as a doping material for improving the color purity of green emission, and has now been reported as obtaining an emission as a blue light-emitting material. This is considered for the following reason: a coumarin-based, short wavelength fluorescent dye is usually high in crystallinity in the form of a simple substance and is not suited as a stable blue emission material in an amorphous form; and at present, an amorphous stable thin film can be obtained according to a co-deposition technique.

For instance, coumarin 450 has a maximum fluorescent wavelength in the vicinity of 446 nm and a chromaticity corresponding to blue among R, G and B. However, coumarin has no electron transportability or hole transportability, so that its characteristics as a luminescent material is apparently poorer in comparison with materials having electron or hole transportability.

Materials, typical of which are zinc metal complexes, enable one to obtain stable blue emission by forming a blue luminescent layer having electron transportability as a single hetero-type structure. However, when an applied voltage is increased in order to obtain a satisfactory brightness, emission predominantly occurs in a region of a good spectral luminous efficacy at an emission spectrum in the vicinity of 700 nm. Eventually, there arises the disadvantage that the chromaticity of blue emission is shifted and comes close to white emission.

Further, the life of an organic electroluminescent device is generally short, and studies for prolonging the life have been extensively made in various fields.

However, for practical application as a display, it is preferred that a half-life time from an initial brightness (of about 200 cd) is 10,000 hours or over. Such an endurance time cannot be obtained yet. This presents a serious problem to solve in order to put the organic electroluminescent devices to practical use.

SUMMARY OF THE INVENTION

An object of the invention is to provide an organic electroluminescent device, which is able to realize blue emission of good chromaticity in a high luminous efficiency and high brightness.

Another object of the invention is to provide an organic electroluminescent device, which is able to continue stable emission over a long time.

Under the circumstances in the art, we have made intensive studies on applications of existing materials whose natures are well known, thereby causing amorphous thin films capable of emitting luminescence of good chromaticity in high brightness to efficiently emit luminescence. This will lead to considerable shortage of time in study and development, to realization of full color arrangements including a color display and also to contribution to the prolonged life of the device.

More particularly, according to the invention, there is provided an organic electroluminescent device of the type which comprises an emission region made of an organic compound and is constituted of a built-up body made of organic substances and including the emission region, wherein a portion contacting a main emission region contains a bathophenanthroline derivative of the general formula General Formula:

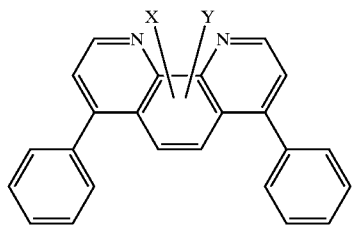

wherein X and Y may be the same or different and independently represent a hydrogen atom except the case where a hydrogen atom is at the 2 or 9 position, a substituted or unsubstituted alkyl group except the case where a methyl group is at the 2 or 9 position, a substituted or unsubstituted cycloalkyl group, a substituted or unsubstituted aryl group, a substituted or unsubstituted amino group, a halogen atom, a nitro group, a cyano group or a hydroxyl group provided that at least one of these groups is contained at an arbitrary position.

In the electroluminescent device of the invention, the bathophenanthroline derivative that is contained in a portion contacting the main emission region acts to block the transport of holes, so that emission is obtained through electron-hole re-combination in a hole transport organic material (i.e. a hole transport layer has such a structure serving also as a luminescent layer that is an electron-hole re-combination region), so that stable emission of high brightness, especially, blue emission, is enabled by low voltage drive. The bathophenanthroline derivative has emission properties. Accordingly, there can be obtained not only light emission from the hole transport layer, but also emission from the bathophenanthroline derivative. At least one of the above emissions can be obtained.

Although fabrication of an organic electroluminescent device, and particularly, an amorphous organic electroluminescent device of the low voltage drive, spontaneous emission and thin type, has been considered to be difficult in view of its structure due to the absence of an electron transport material with excellent non-luminous properties, the invention can provide an organic electroluminescent device wherein its hole transport layer serves also as a luminescent layer that is a re-combination region of electrons and holes and which has a device structure of a long life capable of continuing stable emission over a long time.

More particularly, when an organic electroluminescent device is so arranged as to comprise a hole transport layer as a luminescent layer, stable emission can be obtained in high brightness and high efficiency. Especially, this becomes more appreciable with respect to blue emission, enabling one to obtain a peak brightness of 10,000 cd/m$^2$ or over by DC drive and a peak brightness, calculated as DC, of 55,000 cd/m$^2$ by pulse drive with a duty ratio of $1/100$.

Aside from the blue emission device, bluish green emission, red or yellow emission via doping, and the control in chromaticity by doping are possible. Thus, there can be fabricated an organic electroluminescent-in-blue device capable of blue emission with an excellent chromaticity in high brightness. Hence, the possibility and shortage in time of development of materials, and indices to designs of novel luminescent materials and electron transport material can be shown.

BRIEF DESCRIPTION OF THE DRAWINGS

FIG. 16 is a schematic perspective view showing an example of further another type of prior-art organic EL device.

DETAILED DESCRIPTION OF THE PREFERRED EMBODIMENTS

Figure 1:
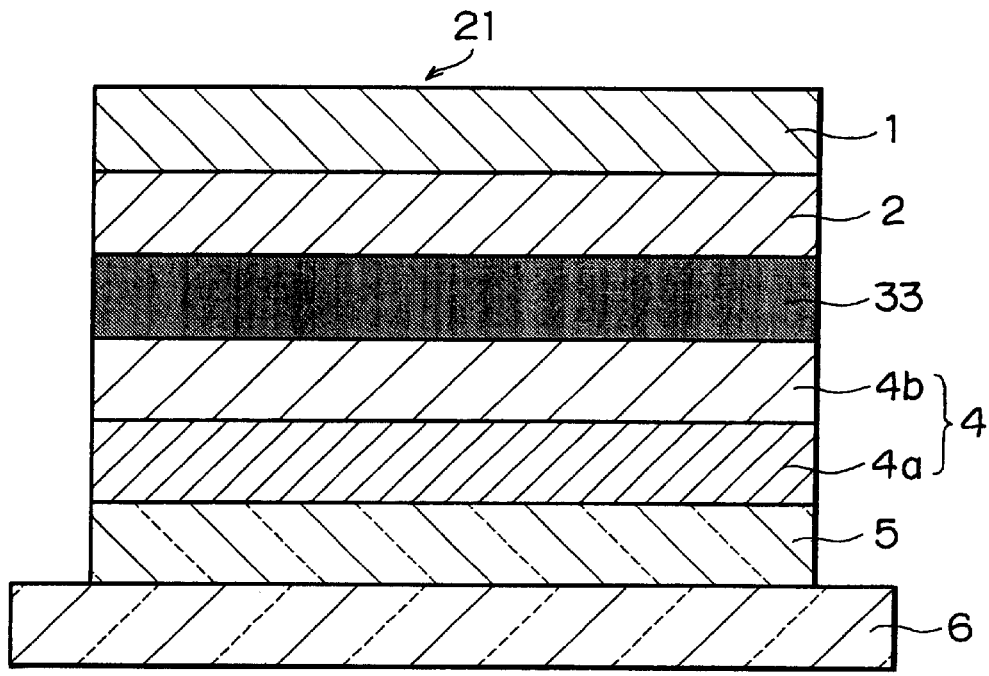
FIG. 1 is a schematic sectional view showing an essential part of an organic electroluminescent device according to a first embodiment of the invention.

In the electroluminescent device of the invention, the emission region is mainly composed of an organic hole transport layer, and it is preferred that a hole-blocking layer is provided in order to cause the re-combination in the hole transport layer.

It is also preferred that the hole-blocking layer is provided between the hole transport layer and an electron transport layer.

Moreover, it is preferable that the highest occupied molecular orbital (HOMO) level of the hole-blocking layer is not higher than a highest occupied molecular orbital level (HOMO) that is a lower one in energy of the highest occupied molecular orbital (HOMO) levels of the respective organic layers (especially, the hole transport layer and the electron transport layer) in contact with opposite sides of the hole-blocking layer.

Moreover, the lowest unoccupied molecular orbital (LUMO) level of the hole-blocking layer should preferably be not lower than a lowest unoccupied molecular orbital (LUMO) level that is a lower one in energy of the lowest unoccupied molecular orbital (LUMO) levels of the respective organic layers (especially, the hole transport layer and the electron transport layer) built up in contact with opposite sides of the hole-blocking layer and not lower than the lowest unoccupied molecular orbital (LUMO) level that is a higher one in energy.

In addition, the hole-blocking layer should preferably be made of a non-luminous material with a low fluorescent yield and may be made of a built-up structure including a plurality of layers.

Moreover, no limitation is placed on the hole-blocking layer with respect to the kind of material therefor. In order to prevent the formation of an exciplex (dimer) (i.e. the lowering of a luminous efficiency) at the interface with the hole transporting luminescent layer, a non-luminous material with a low fluorescent yield is preferred.

The emission region should favorably be made of a hole transport material for short wavelength emission. The materials usable as the hole-blocking layer should preferably include bathophenanthroline derivatives of the general formula indicated in FIG. 2. Specific examples include those of Compound Nos. 1 to 178 indicated below and including structural formulas 1 to 3 indicated in FIGS. 3 to 5, respectively, although not limited to those mentioned above. In the exemplified compounds, Me represents a methyl group, Et represents an ethyl group, Pr represents a propyl group, and Bu represents a butyl group.

The device should preferably comprise, on an optically transparent substrate, a transparent electrode, the above-stated organic built-up body (including an organic hole transport layer, a hole-blocking layer, and an organic electron transport layer) and a metal electrode superposed in this order.

The device having such an arrangement as mentioned above is suitable for use as a device for color display.

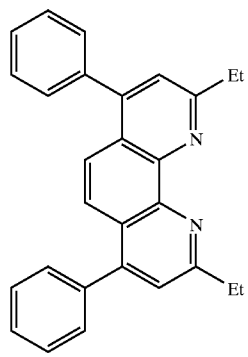

Compound No. 1

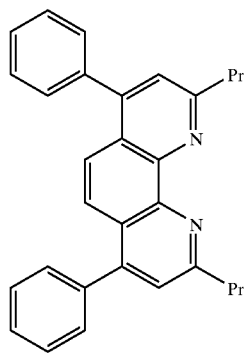

Compound No. 2

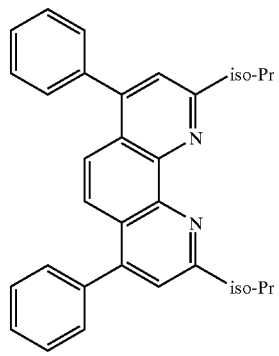

Compound No. 3

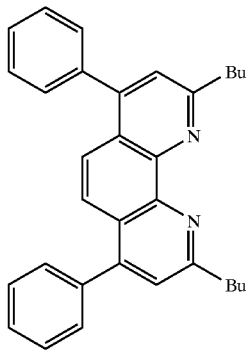

Compound No. 4

Compound No. 5
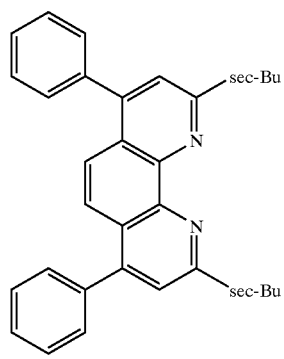
Compound No. 9
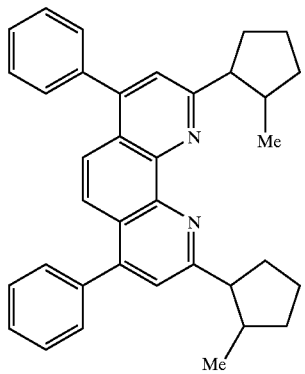
Compound No. 6
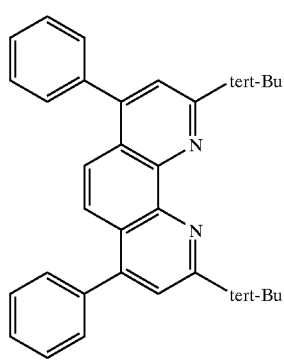
Compound No. 10
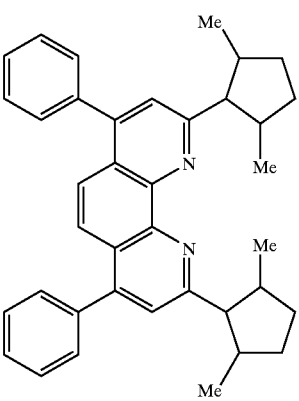
Compound No. 7
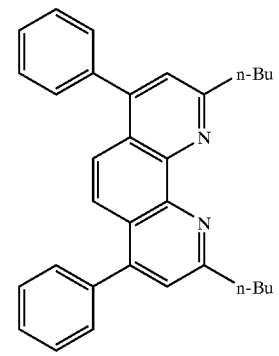
Compound No. 11
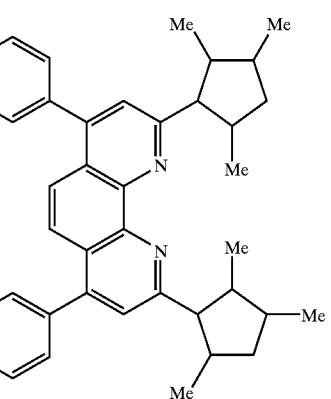
Compound No. 8
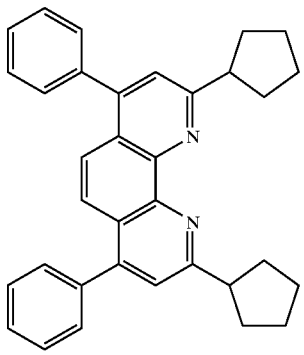
Compound No. 12
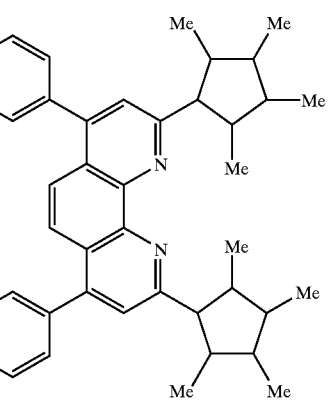

-continued
Compound No. 13
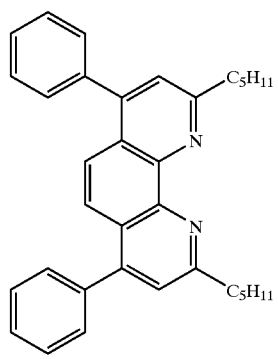
Compound No. 14
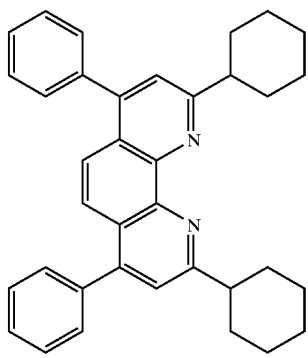
Compound No. 15
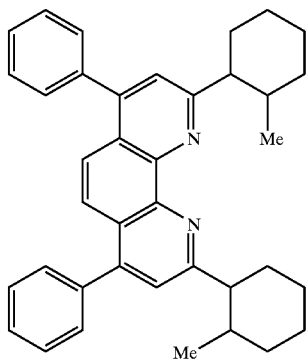
Compound No. 16
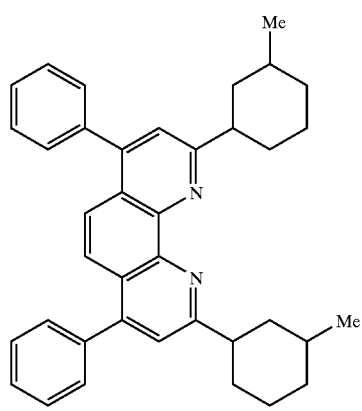
-continued
Compound No. 17
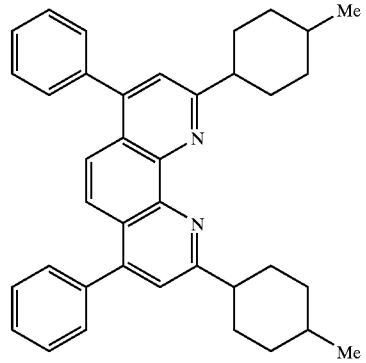
Compound No. 18
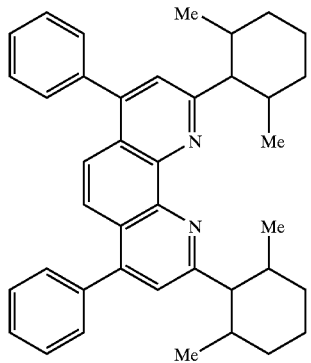
Compound No. 19
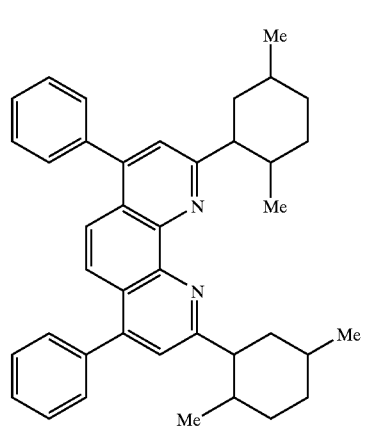
Compound No. 20
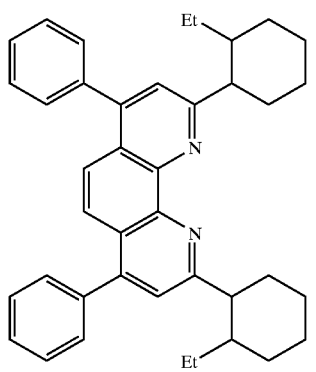

-continued
Compound No. 21
Compound No. 22
Compound No. 23
Compound No. 24
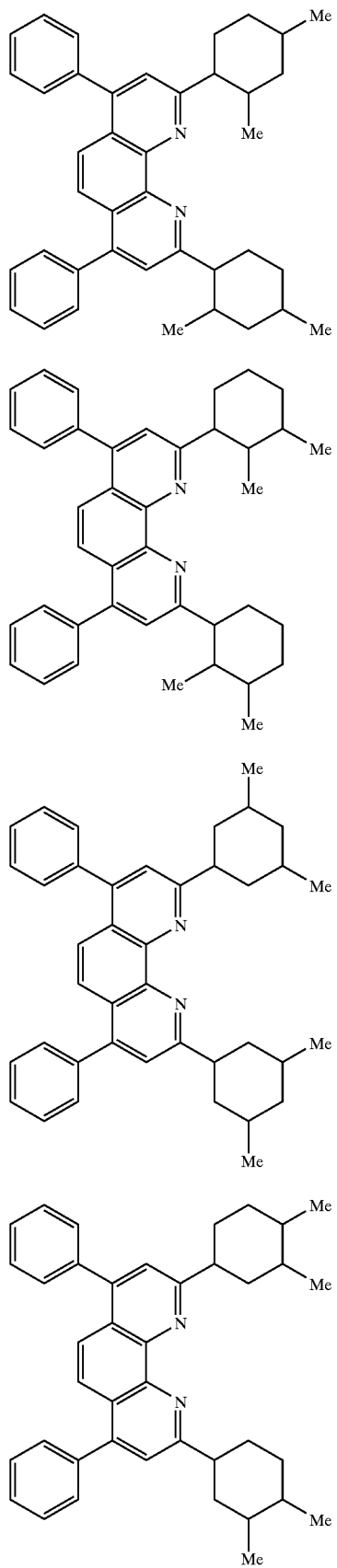
-continued
Compound No. 25
Compound No. 26
Compound No. 27
Compound No. 28
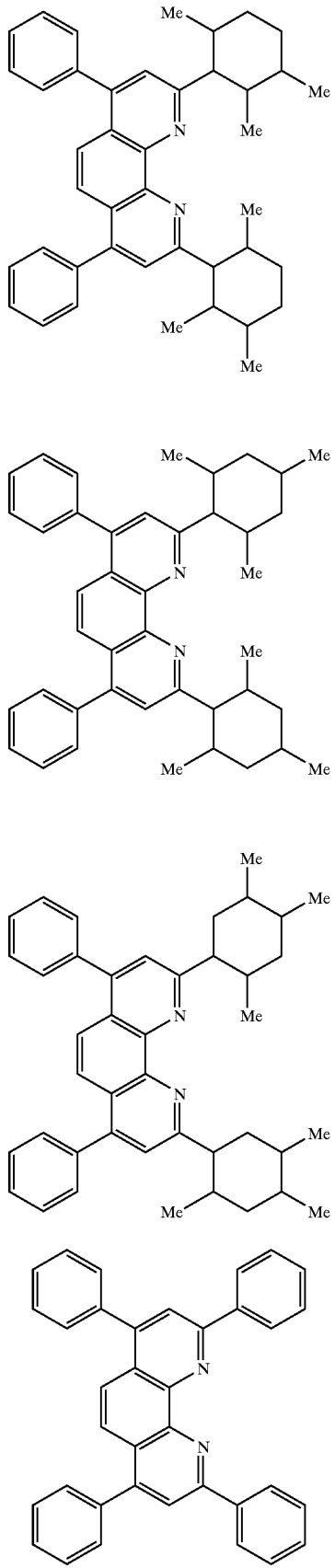

-continued
Compound No. 29
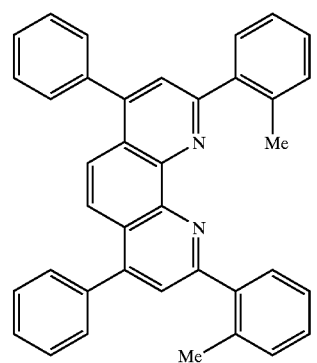
Compound No. 30
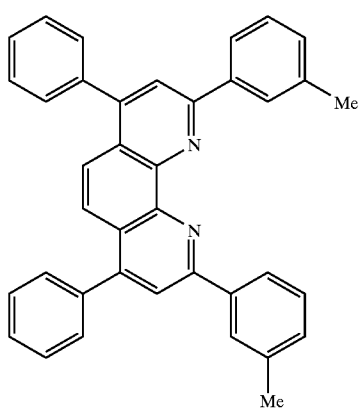
Compound No. 31
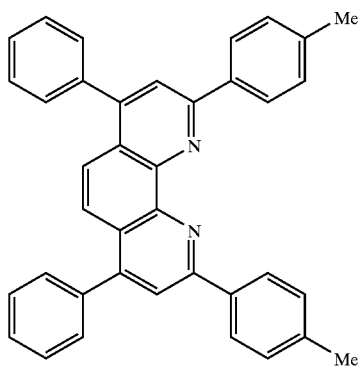
Compound No. 32
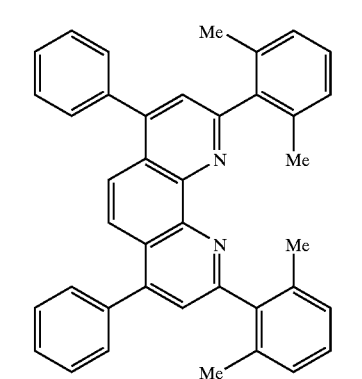
-continued
Compound No. 33
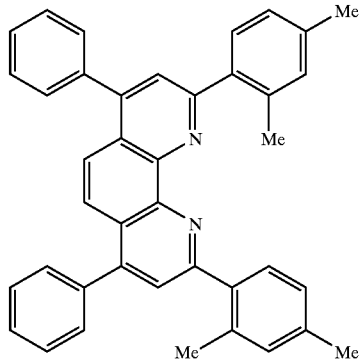
Compound No. 34
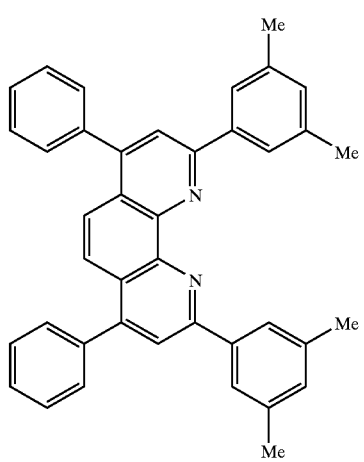
Compound No. 35
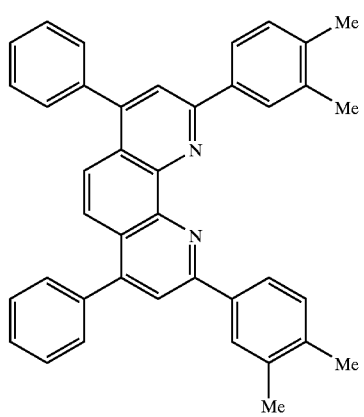
Compound No. 36
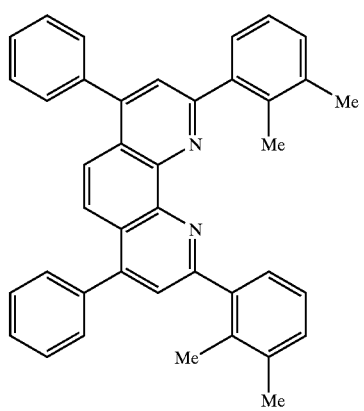

-continued
Compound No. 37
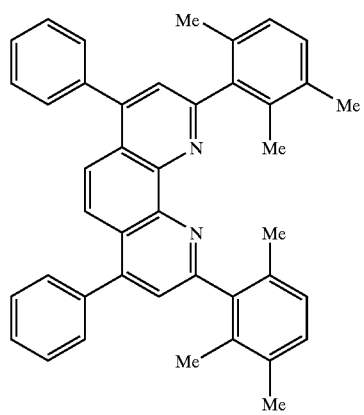
Compound No. 38
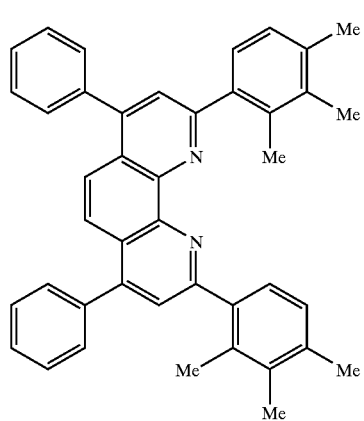
Compound No. 39
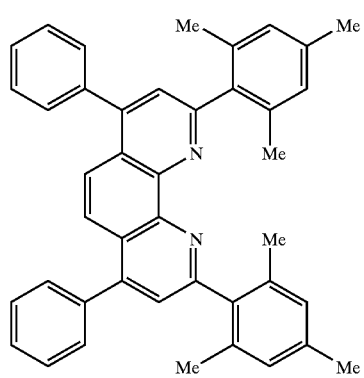
Compound No. 40
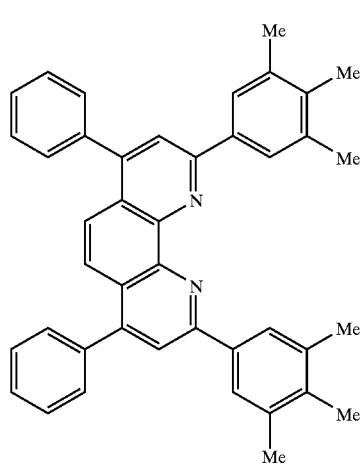
-continued
Compound No. 41
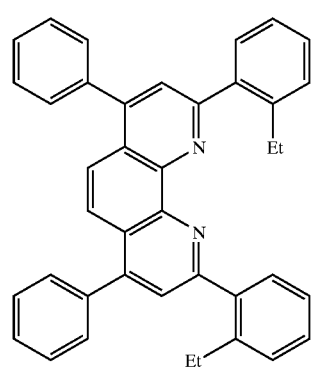
Compound No. 42
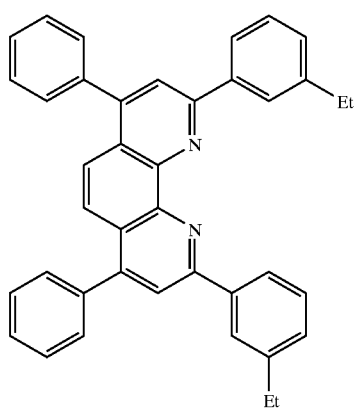
Compound No. 43
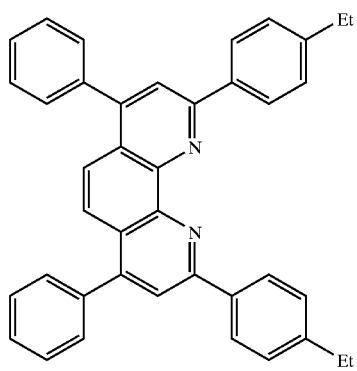
Compound No. 44
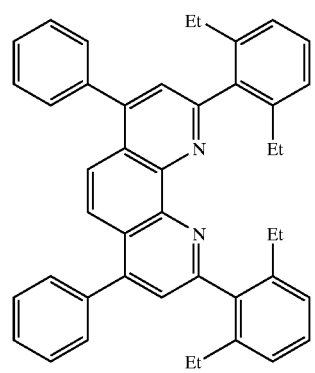

-continued
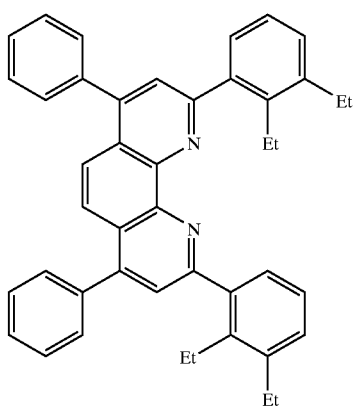
Compound No. 45
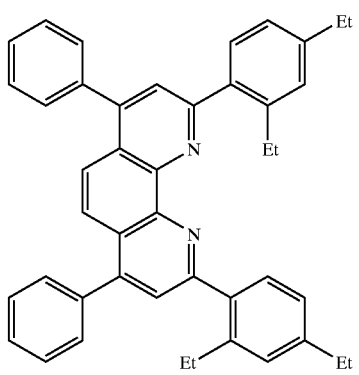
Compound No. 46
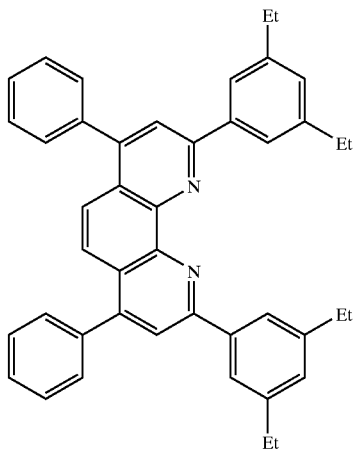
Compound No. 47
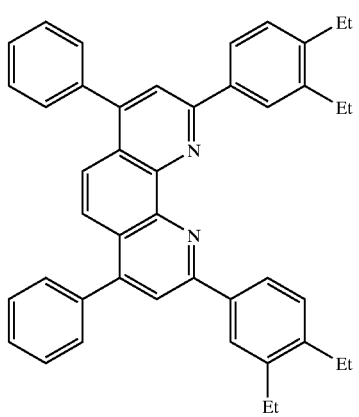
Compound No. 48
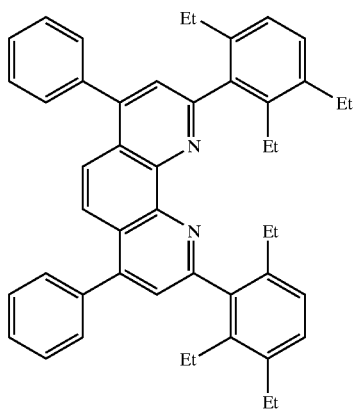
Compound No. 49
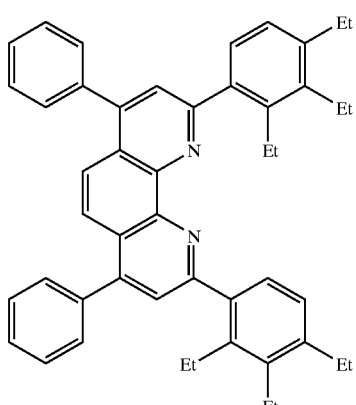
Compound No. 50
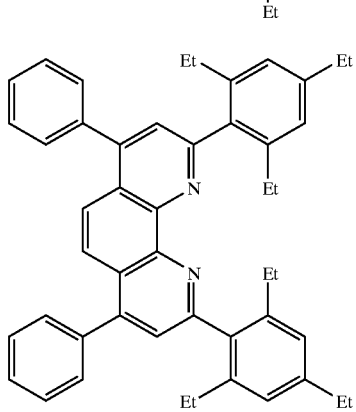
Compound No. 51
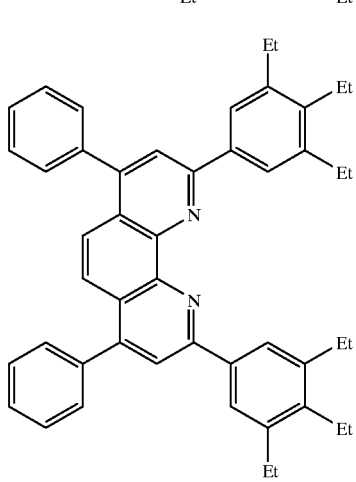
Compound No. 52

-continued
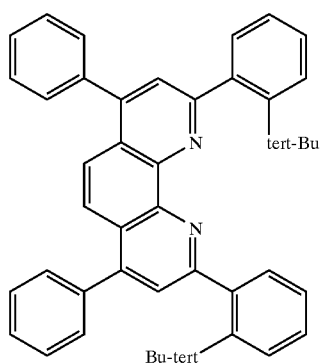
Compound No. 53
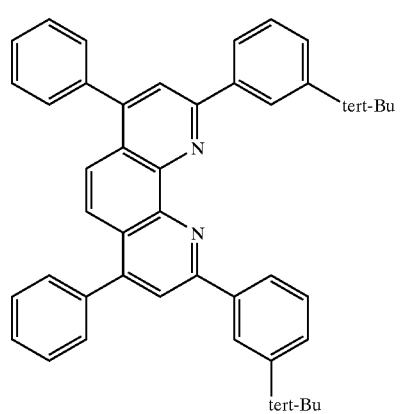
Compound No. 54
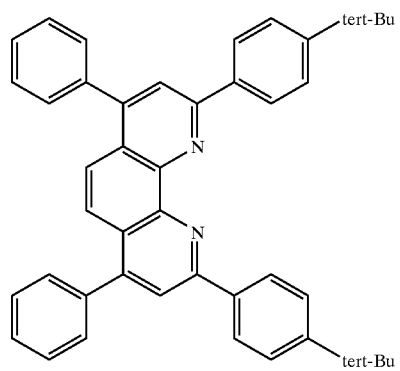
Compound No. 55
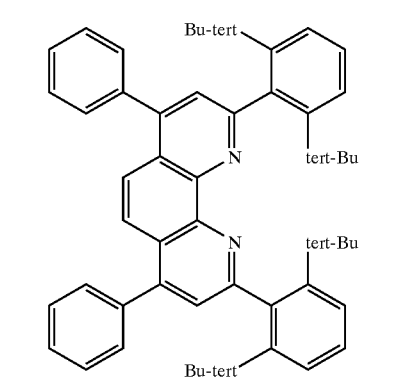
Compound No. 56
-continued
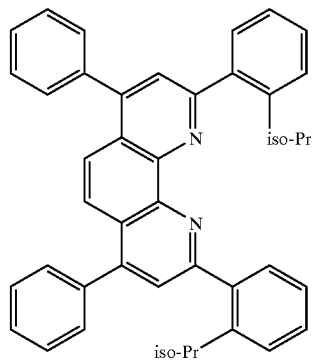
Compound No. 57
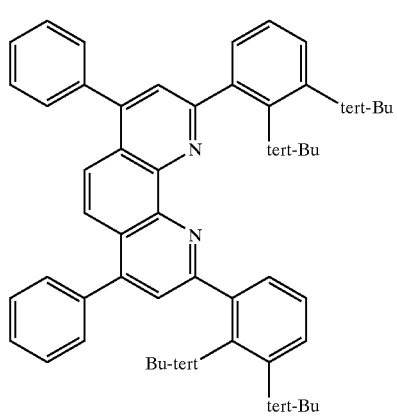
Compound No. 58
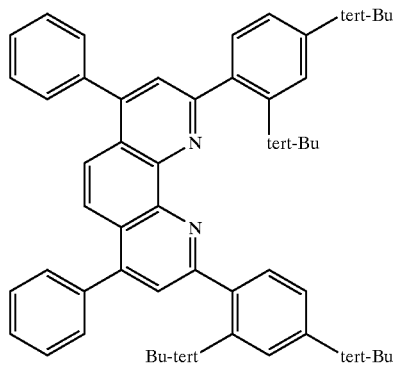
Compound No. 59
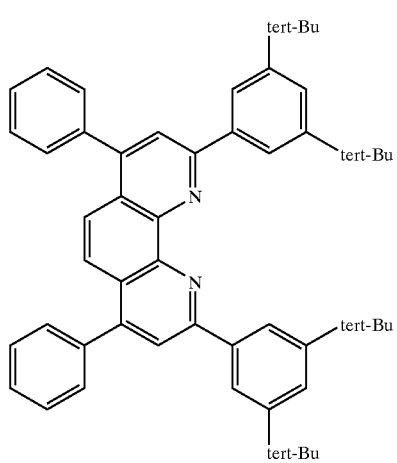
Compound No. 60

-continued
Compound No. 61
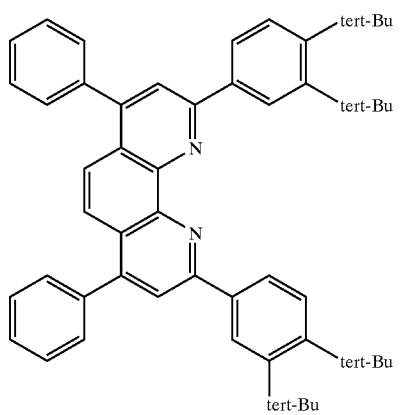
Compound No. 62
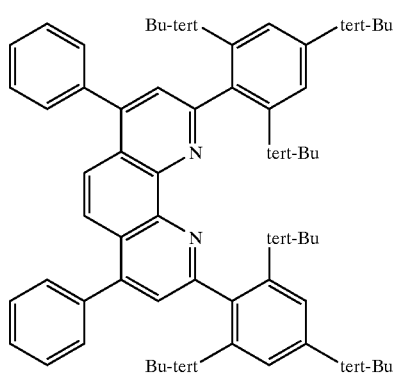
Compound No. 63
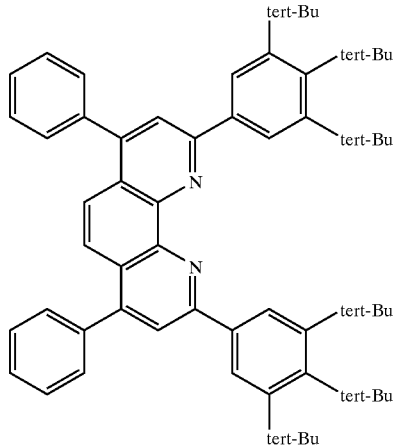
Compound No. 64
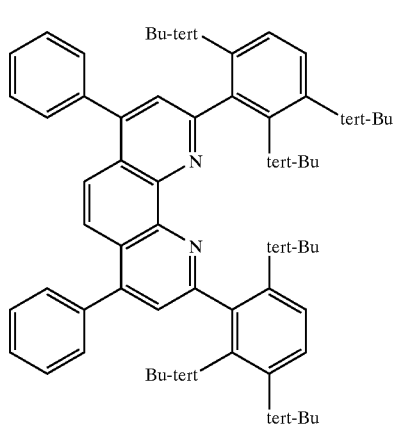
-continued
Compound No. 65
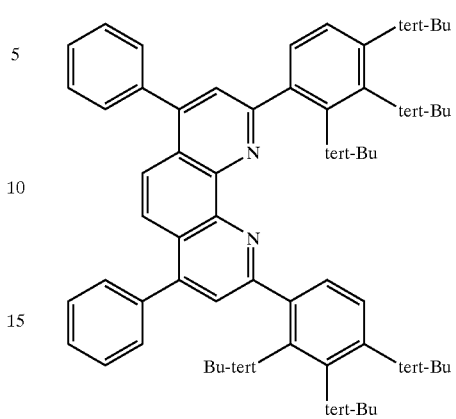
Compound No. 66
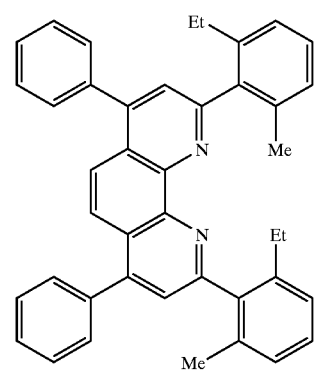
Compound No. 67
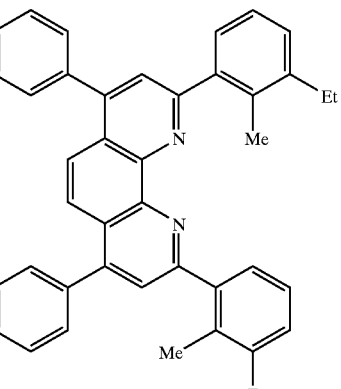
Compound No. 68
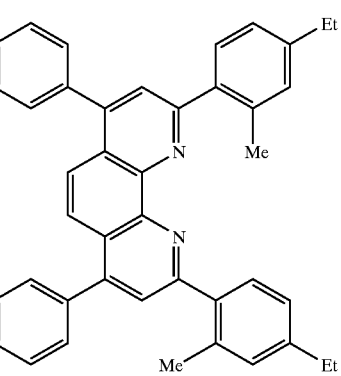

Compound No. 69
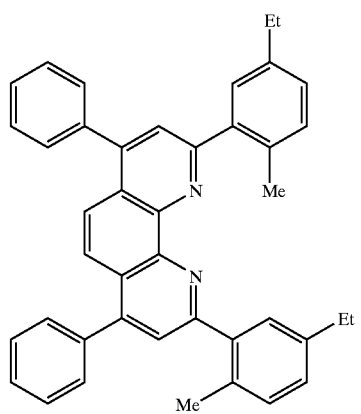
Compound No. 70
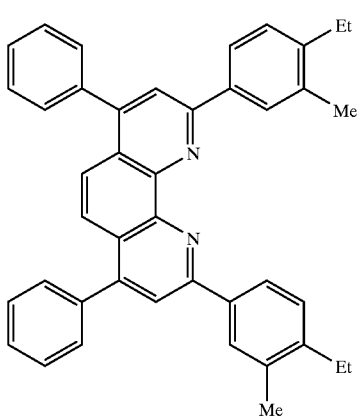
Compound No. 71
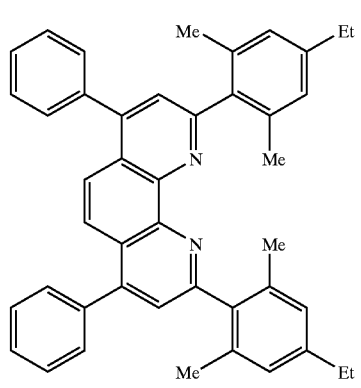
Compound No. 72
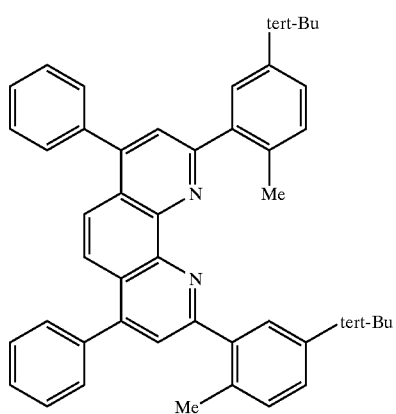
Compound No. 73
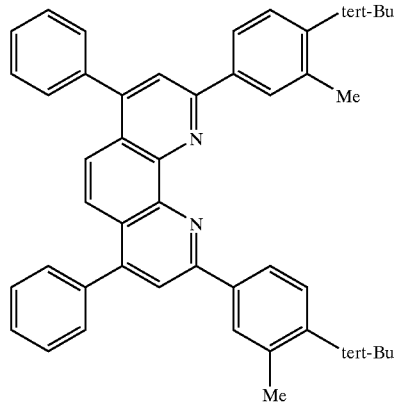
Compound No. 74
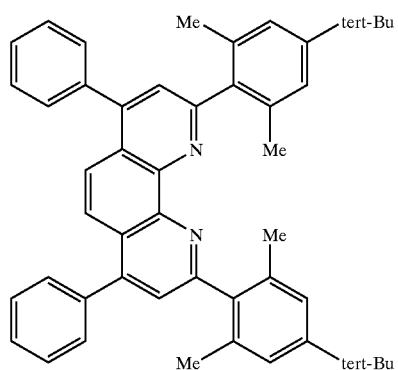
Compound No. 75
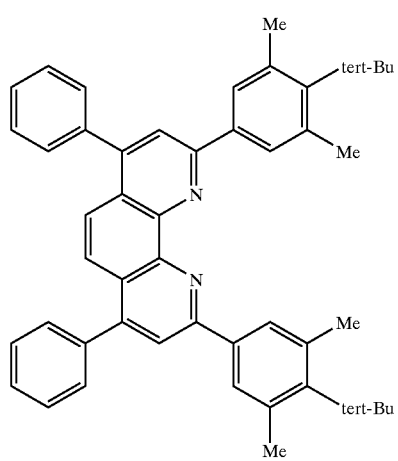

Compound No. 76
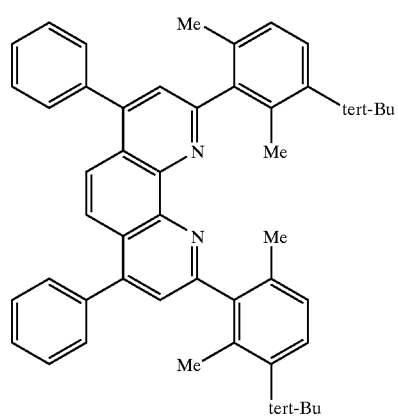
Compound No. 77
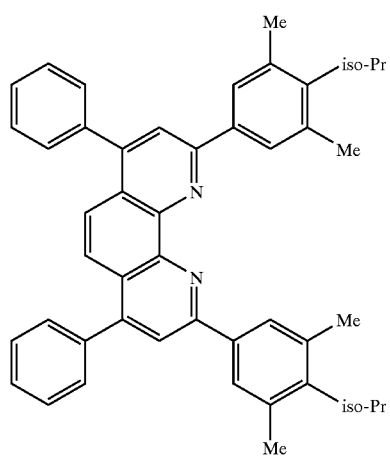
Compound No. 78
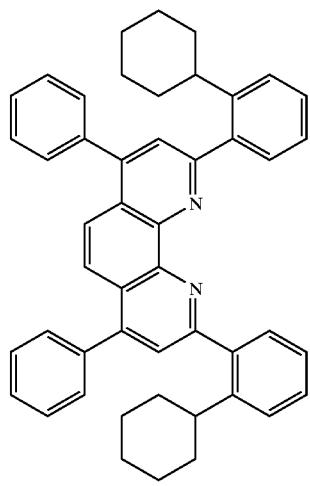
Compound No. 79
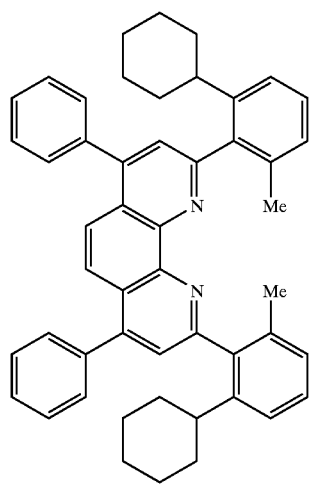
Compound No. 80
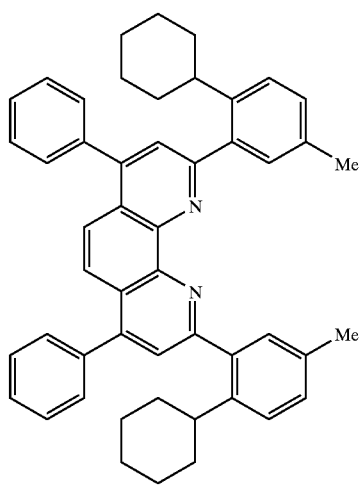
Compound No. 81
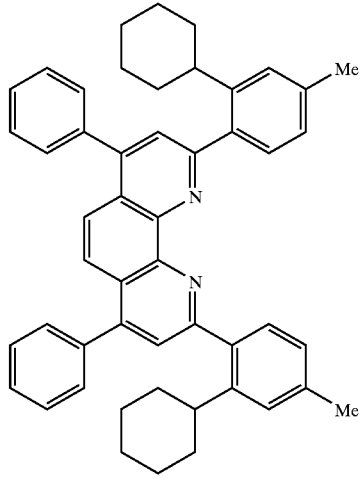

Compound No. 82
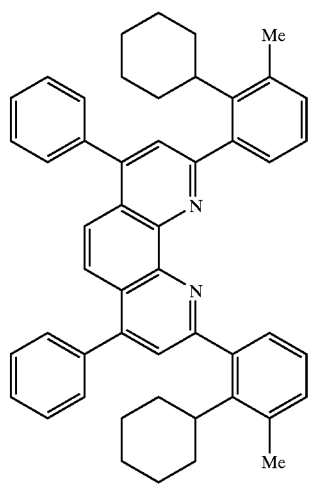
Compound No. 85
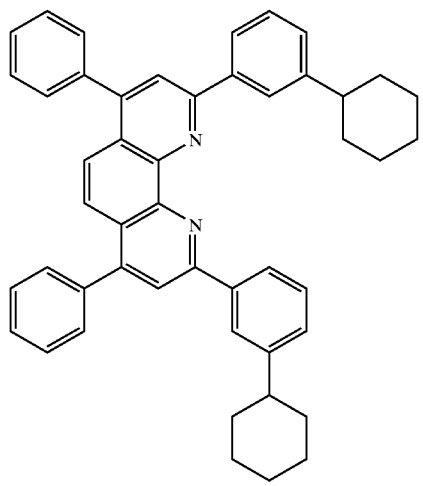
Compound No. 83
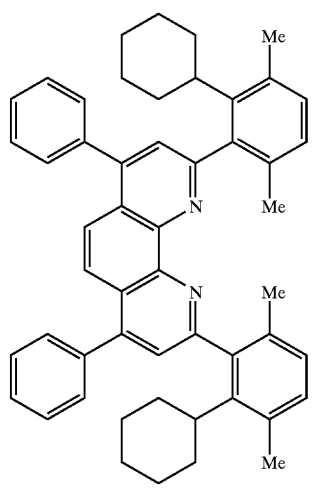
Compound No. 86
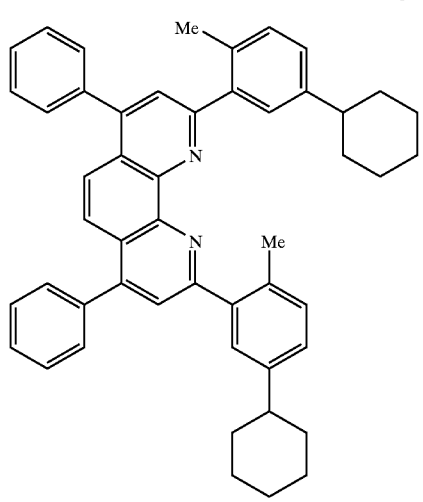
Compound No. 84
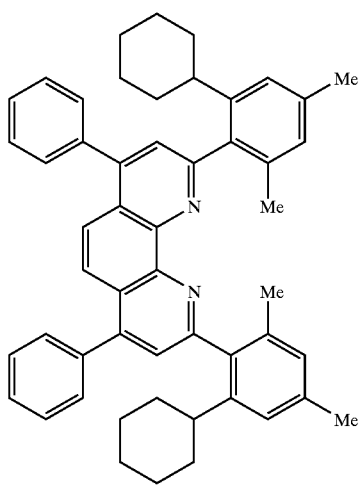
Compound No. 87
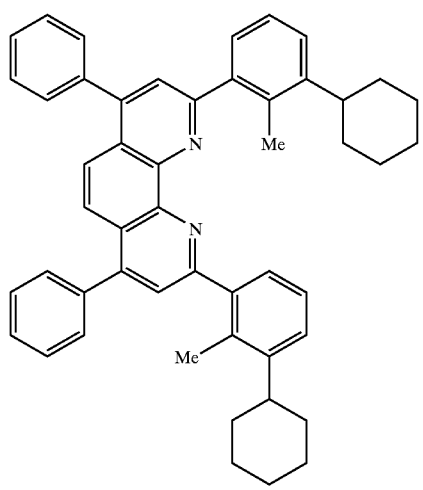

Compound No. 88
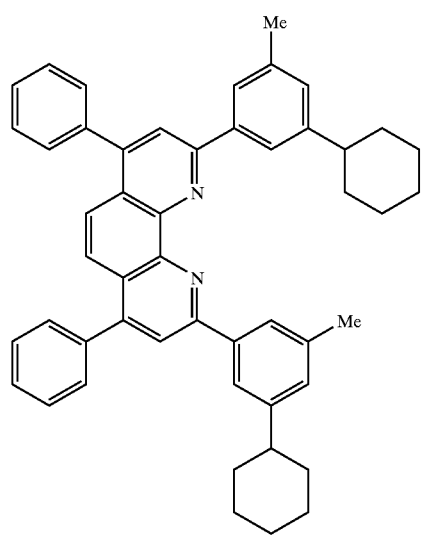
Compound No. 89
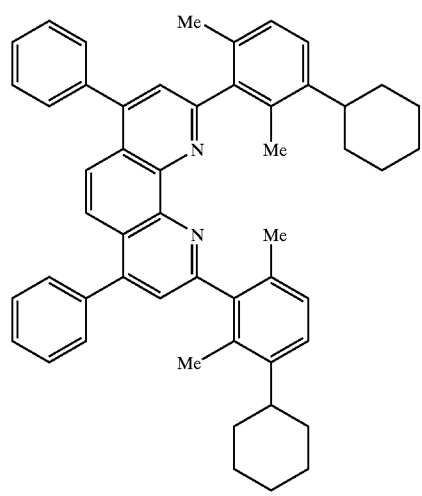
Compound No. 90
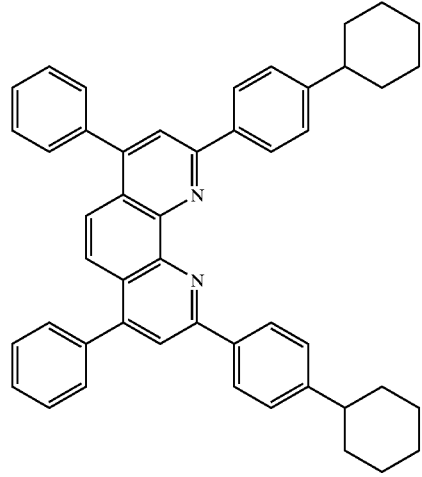
Compound No. 91
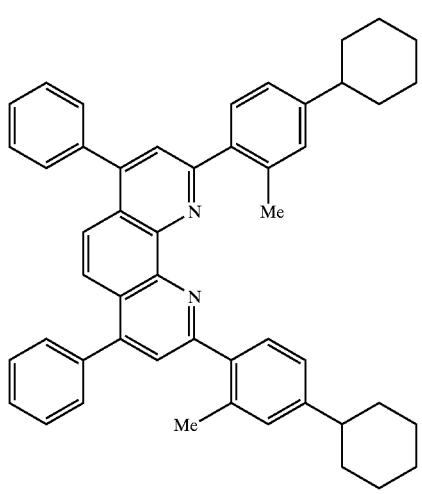
Compound No. 92
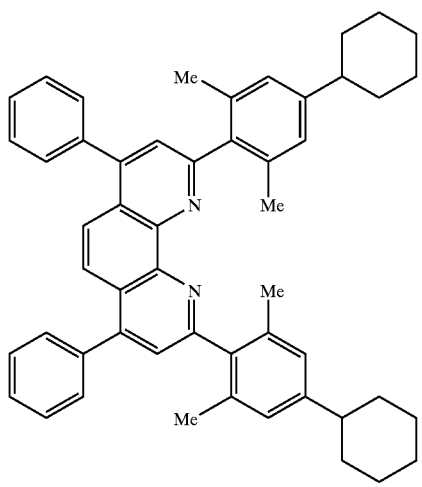
Compound No. 93
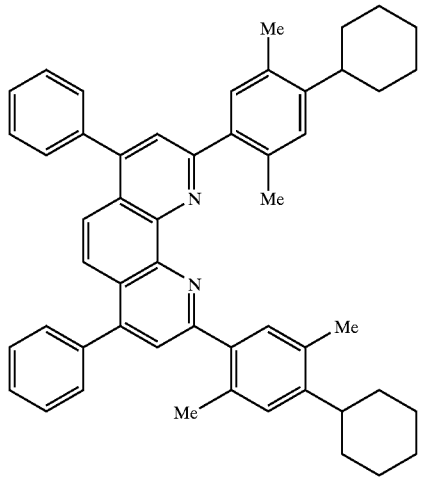

Compound No. 94
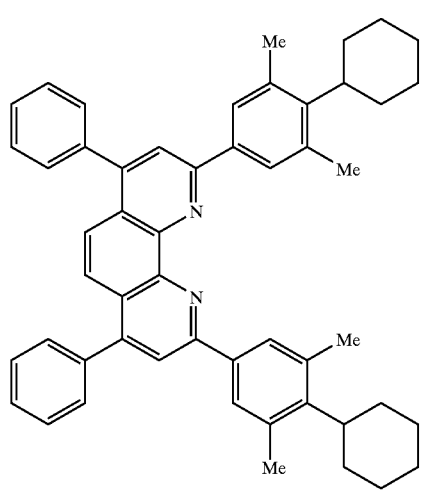
Compound No. 97
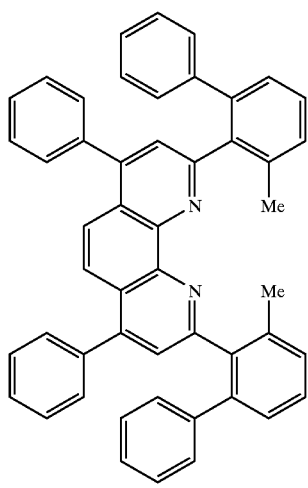
Compound No. 95
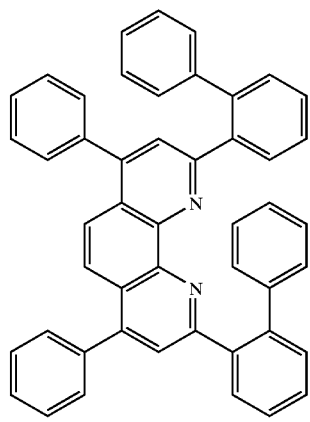
Compound No. 98
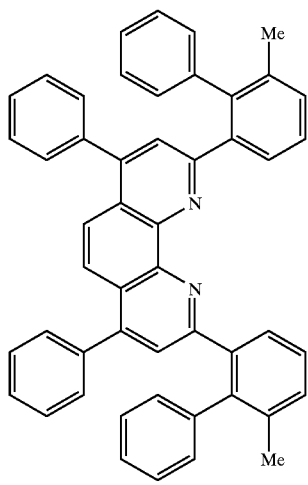
Compound No. 96
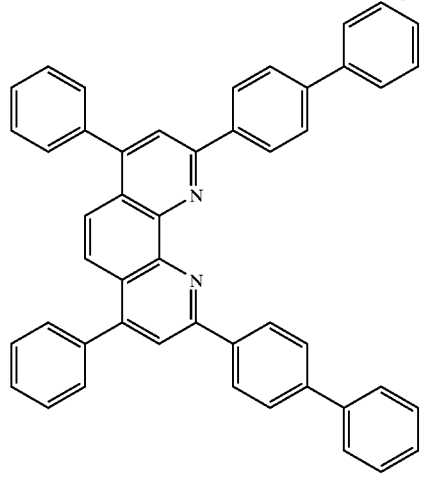
Compound No. 99
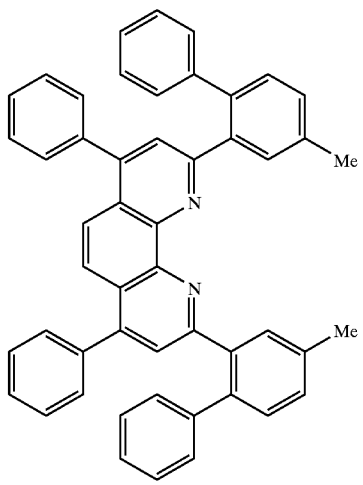

Compound No. 100
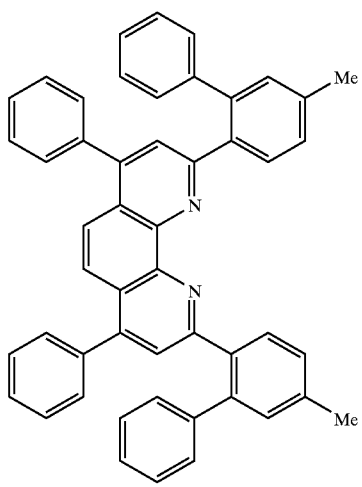
Compound No. 103
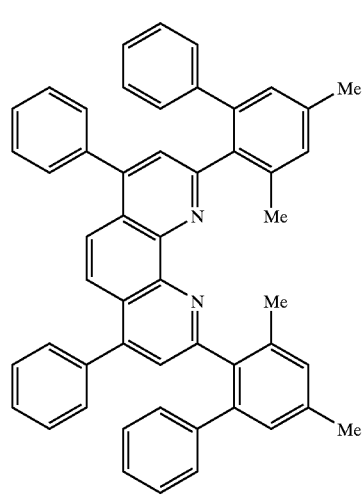
Compound No. 101
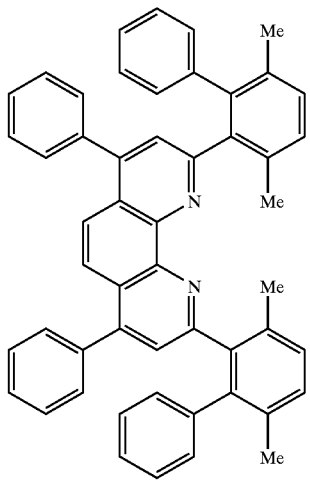
Compound No. 104
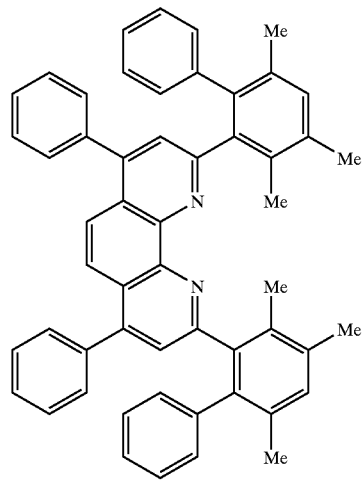
Compound No. 102
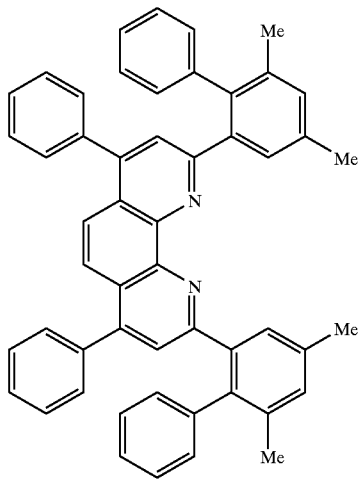
Compound No. 105
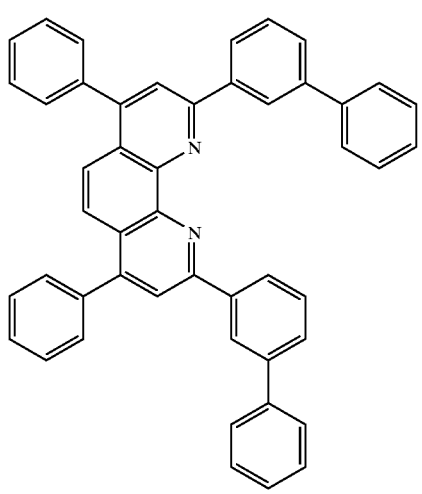

-continued
Compound No. 106
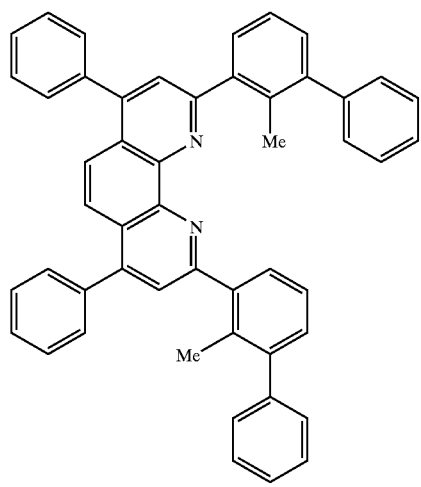
Compound No. 107
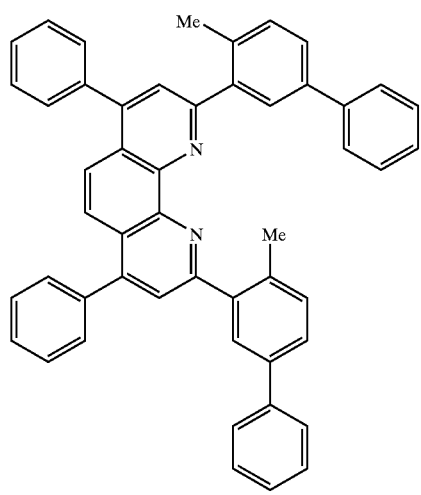
Compound No. 108
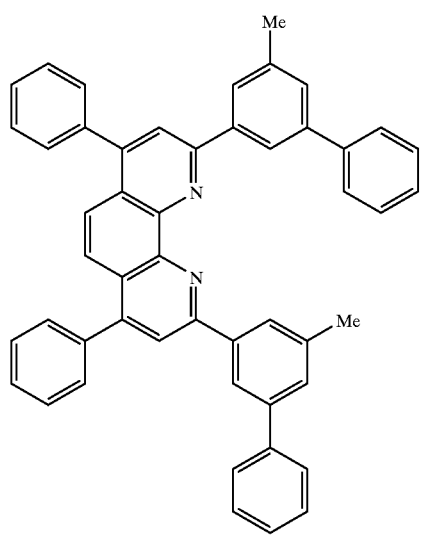
-continued
Compound No. 109
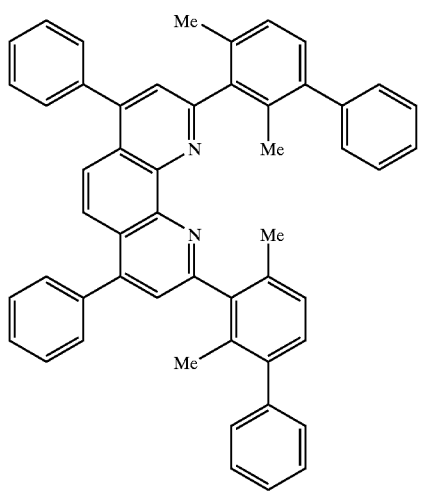
Compound No. 110
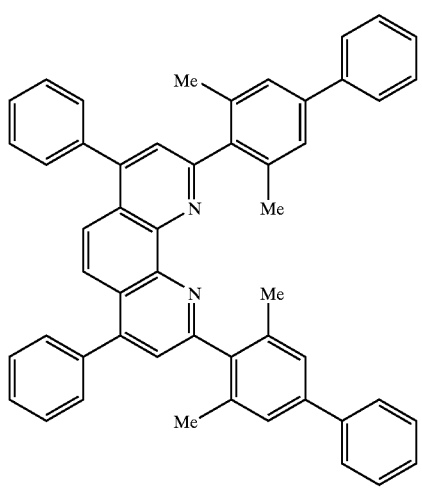
Compound No. 111
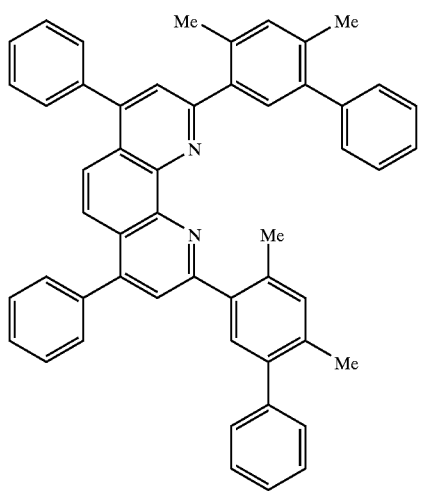

Compound No. 112
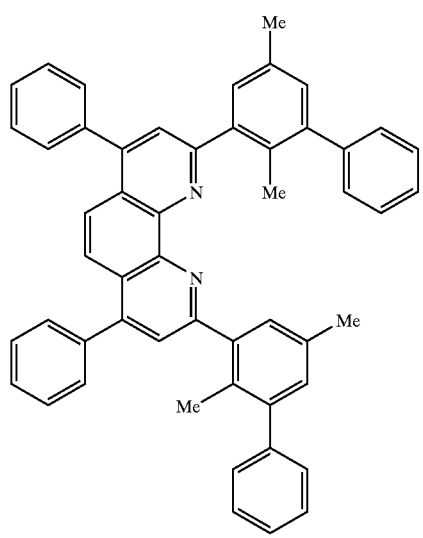
Compound No. 113
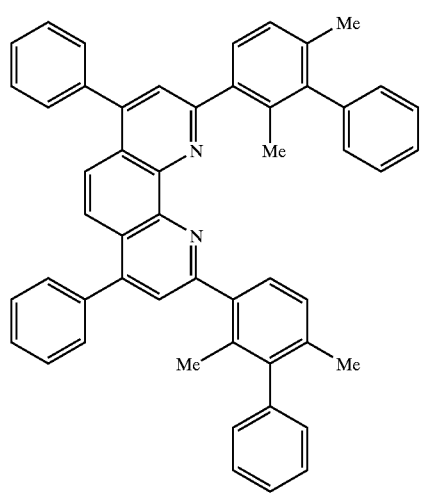
Compound No. 114
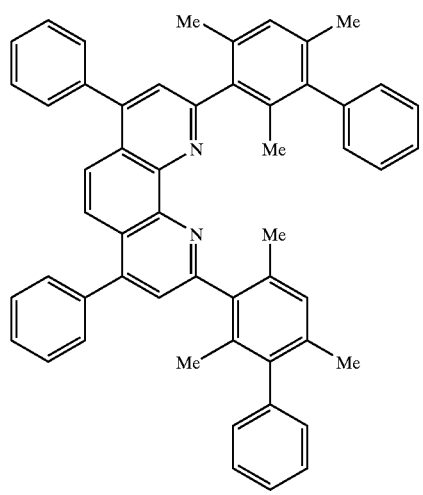
Compound No. 115
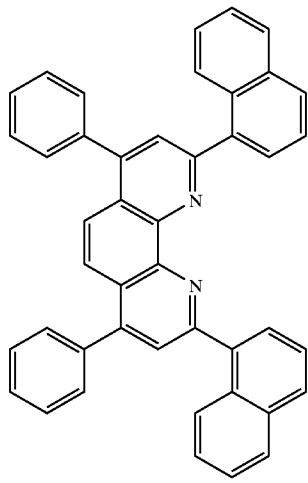
Compound No. 116
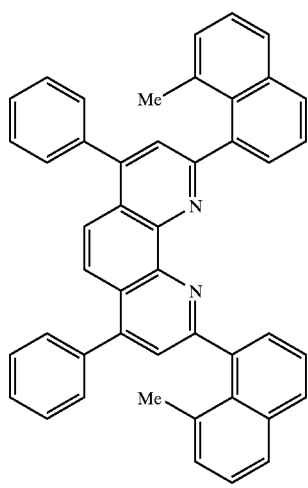
Compound No. 117
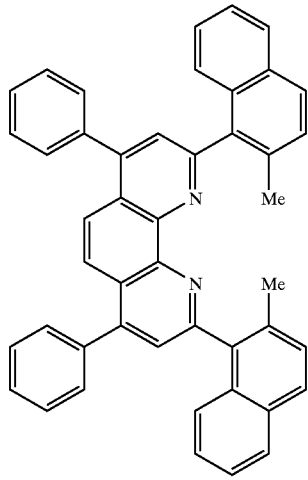

Compound No. 118
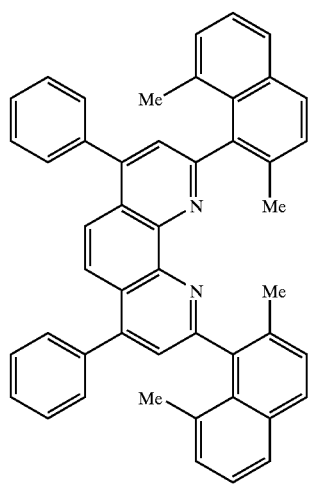
Compound No. 119
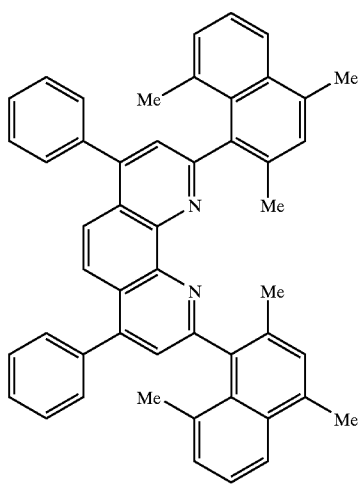
Compound No. 120
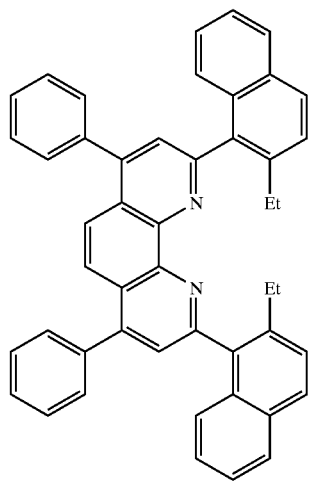
Compound No. 121
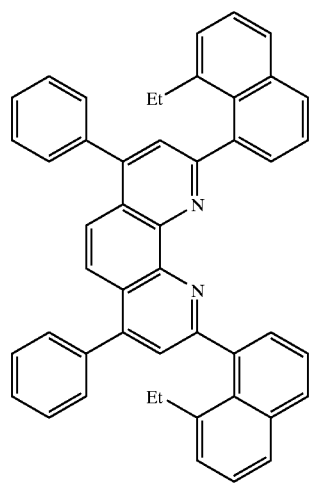
Compound No. 122
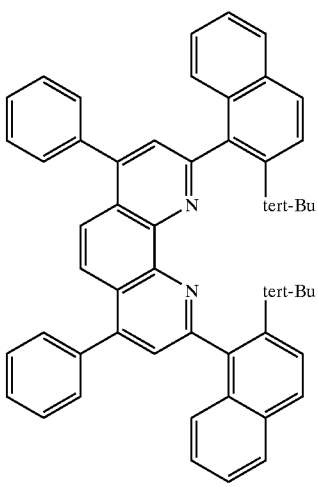
Compound No. 123
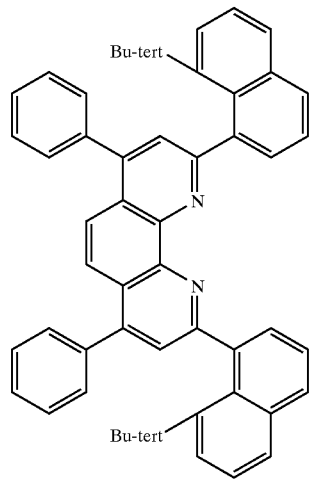

-continued
Compound No. 124
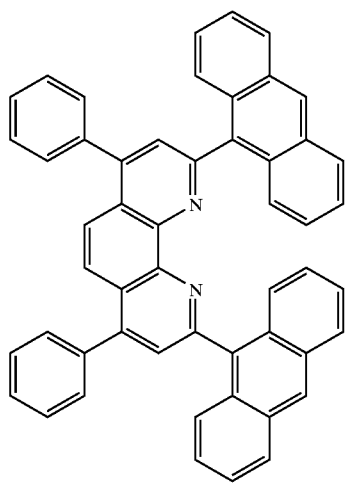
Compound No. 125
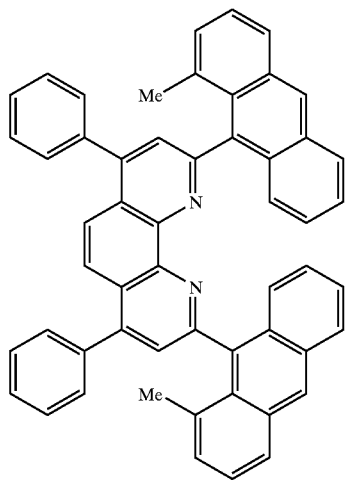
Compound No. 126
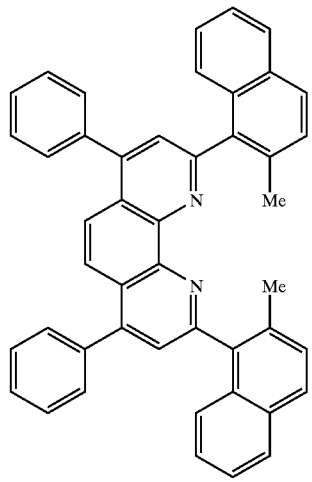
Compound No. 127
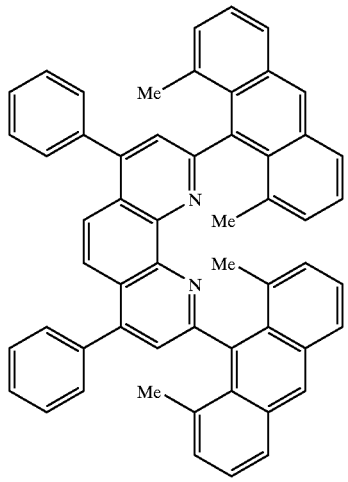
Compound No. 128
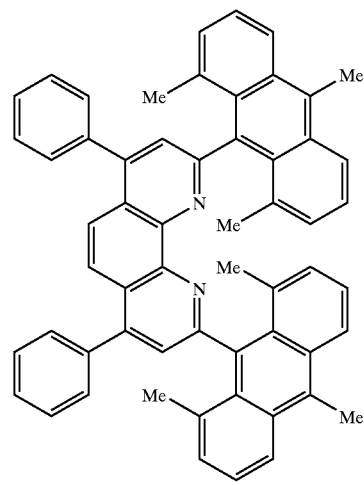
Compound No. 129
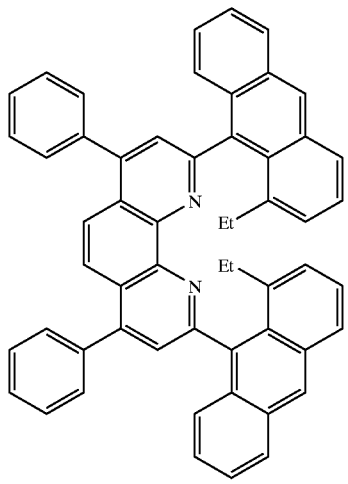

Compound No. 130
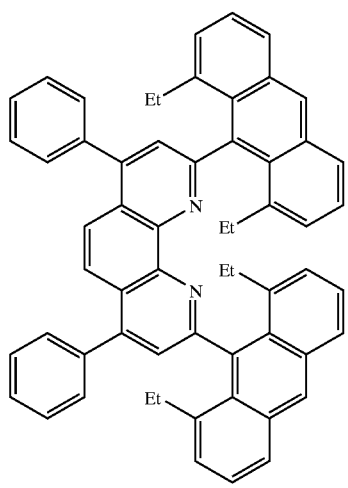
Compound No. 133
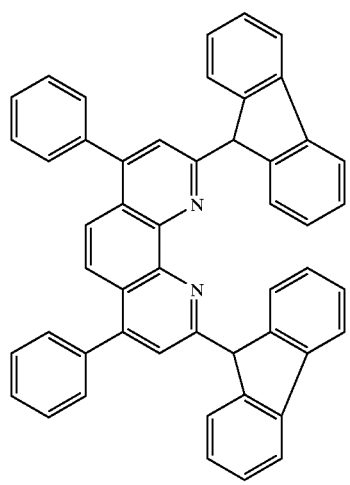
Compound No. 131
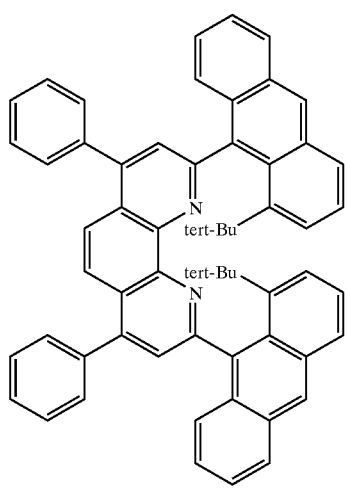
Compound No. 134
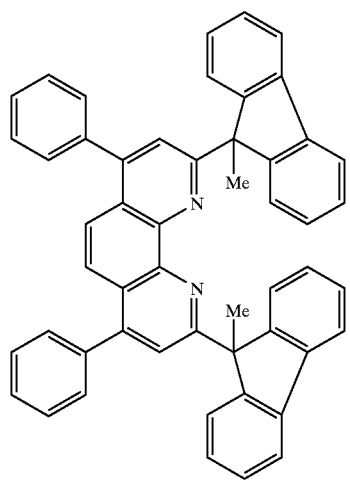
Compound No. 132
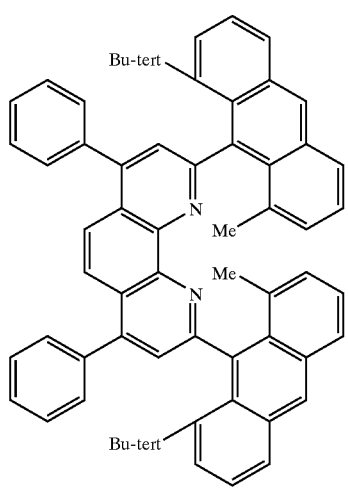
Compound No. 135
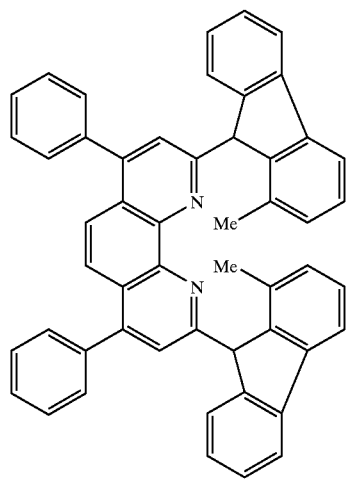

Compound No. 136
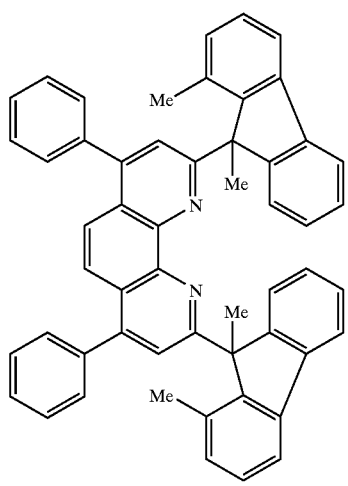
Compound No. 137
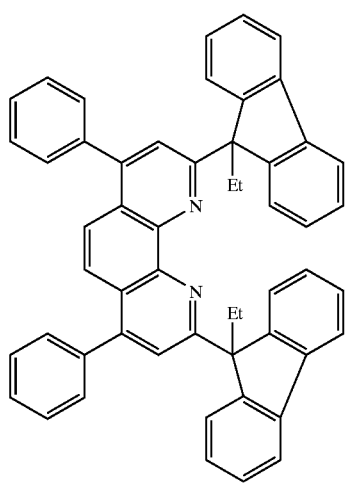
Compound No. 138
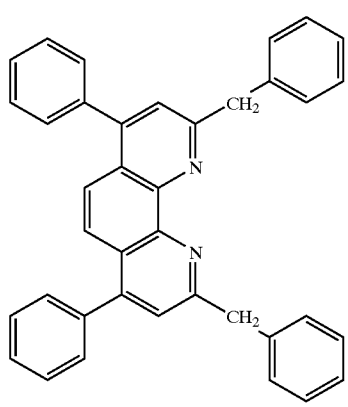
Compound No. 139
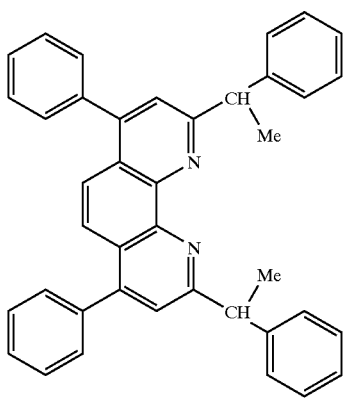
Compound No. 140
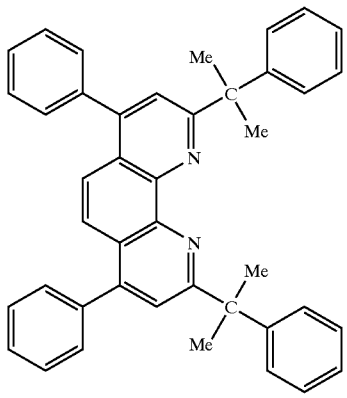
Compound No. 141
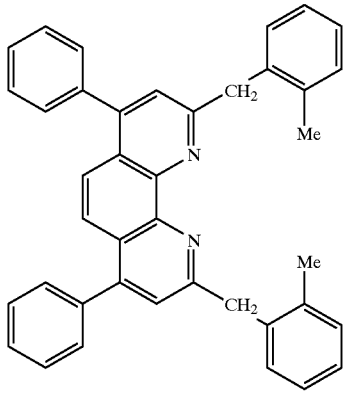
Compound No. 142
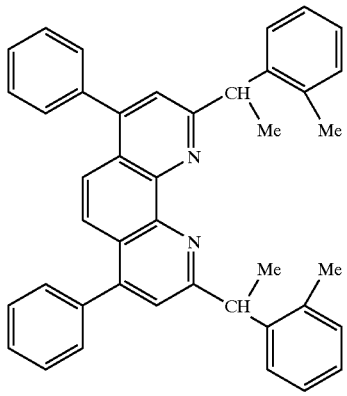

-continued
Compound No. 143
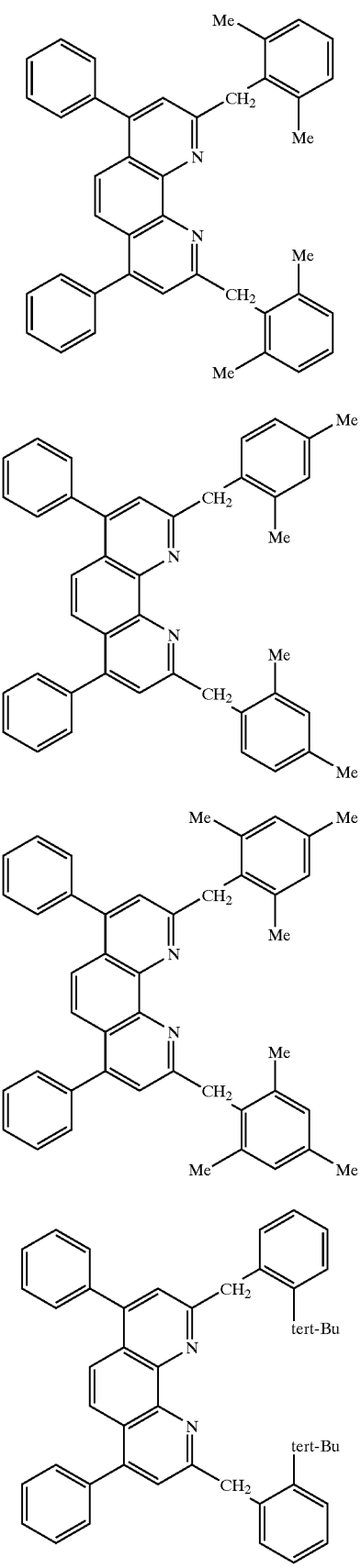
Compound No. 144
Compound No. 145
Compound No. 146
Compound No. 147
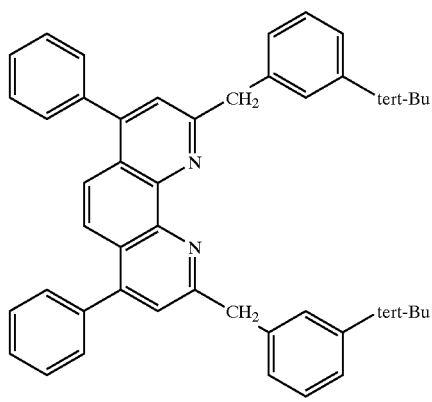
Compound No. 148
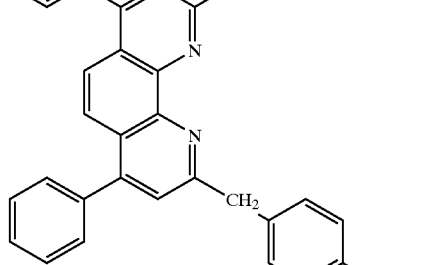
Compound No. 149
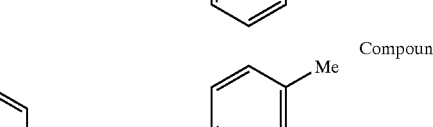
Compound No. 150
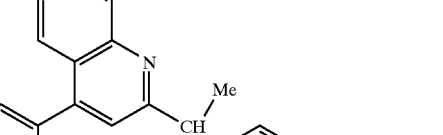

Compound No. 151
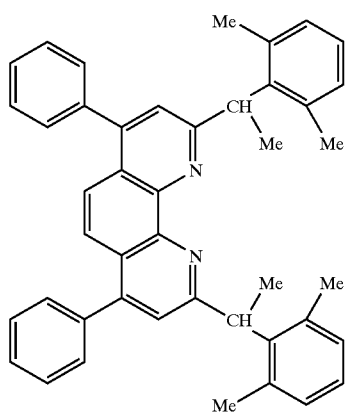
Compound No. 154
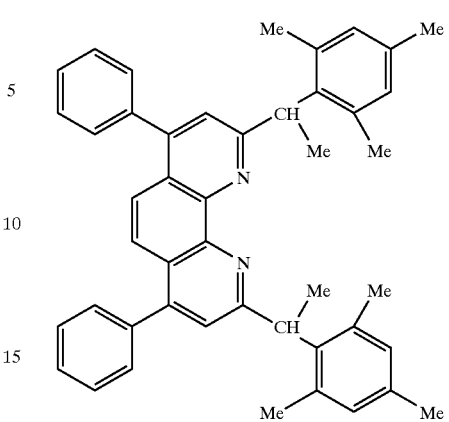
Compound No. 152
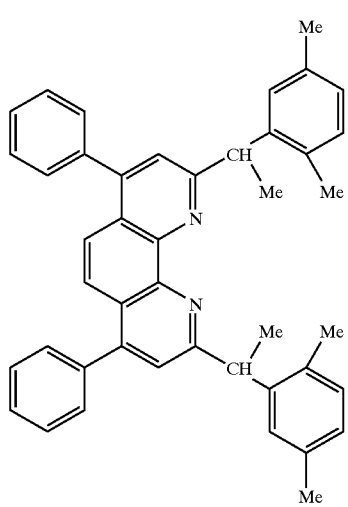
Compound No. 155
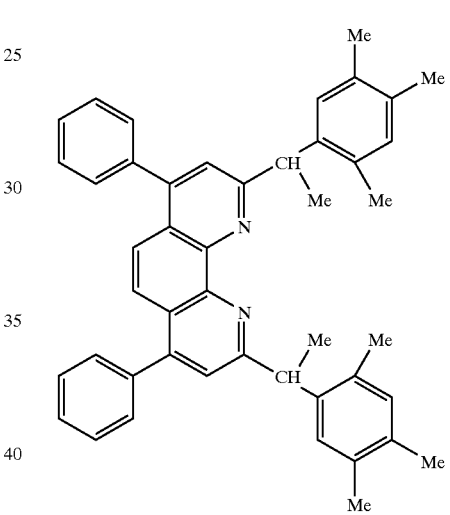
Compound No. 153
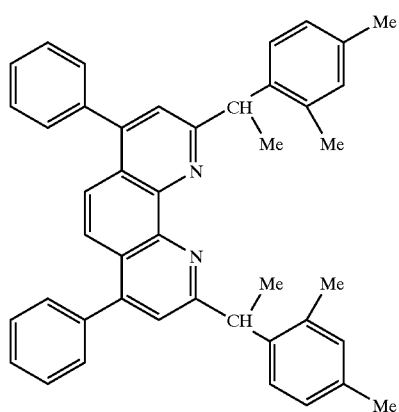
Compound No. 156
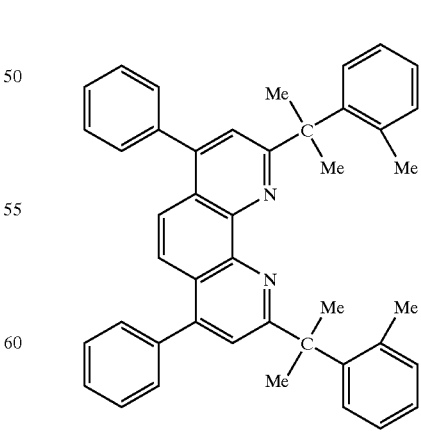

Compound No. 157
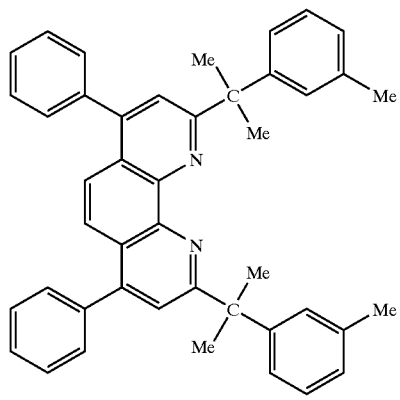
Compound No. 158
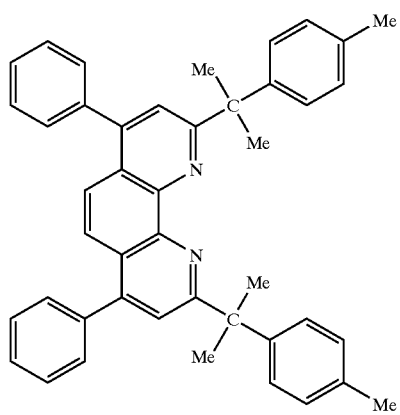
Compound No. 159
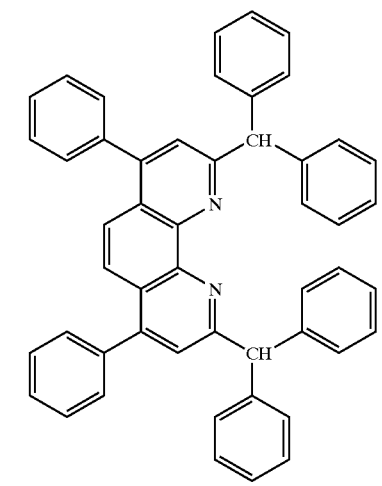
Compound No. 160
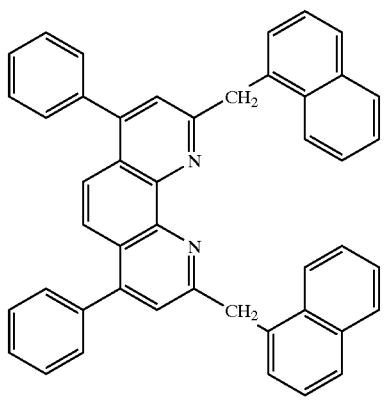
Compound No. 161
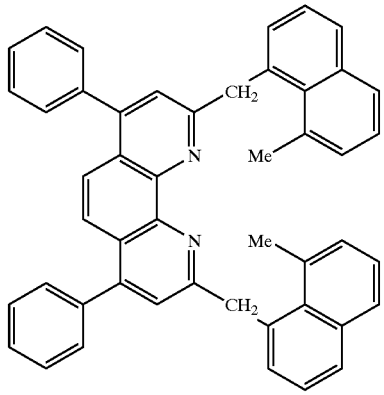
Compound No. 162
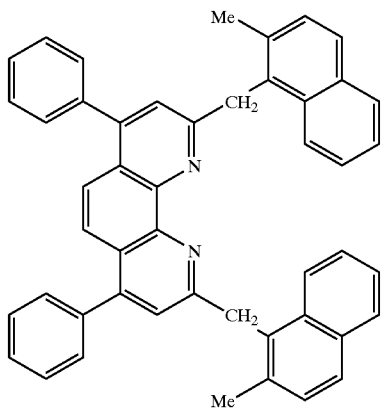
Compound No. 163
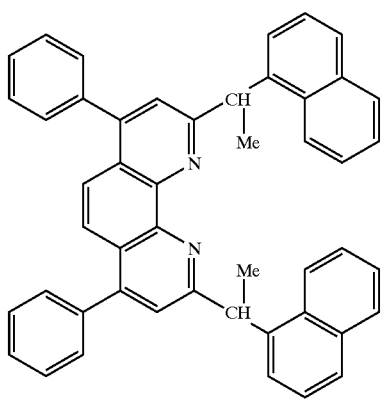

Compound No. 164
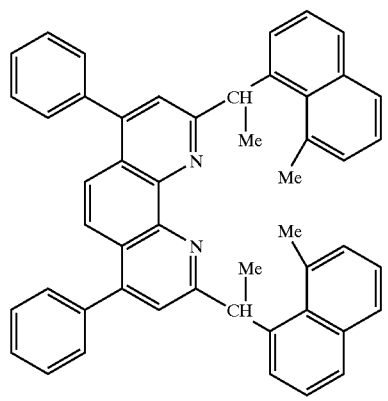
Compound No. 165
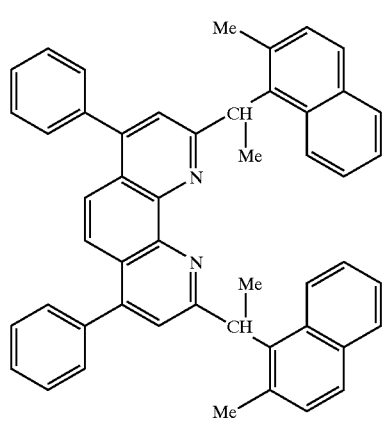
Compound No. 166
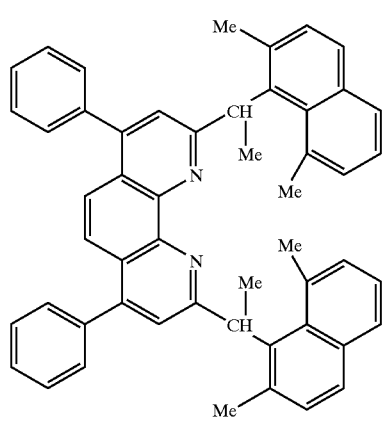
Compound No. 167
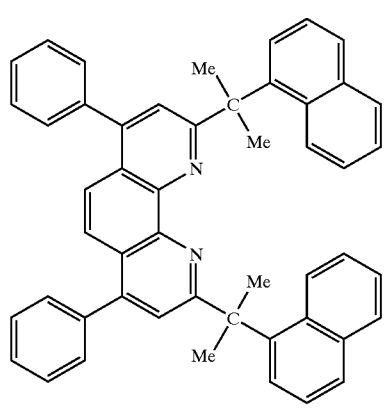
Compound No. 168
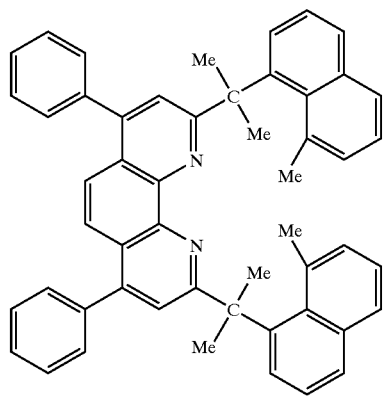
Compound No. 169
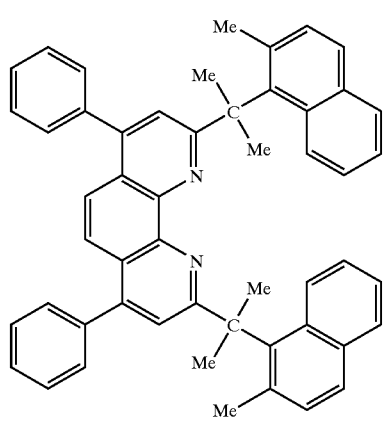
Compound No. 170
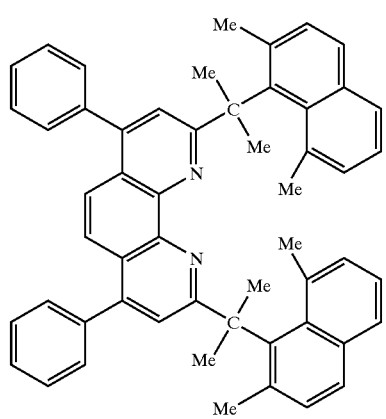
Compound No. 171
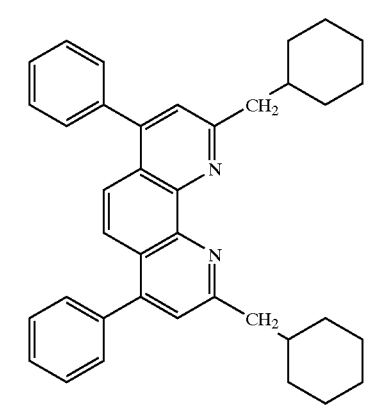

Compound No. 172
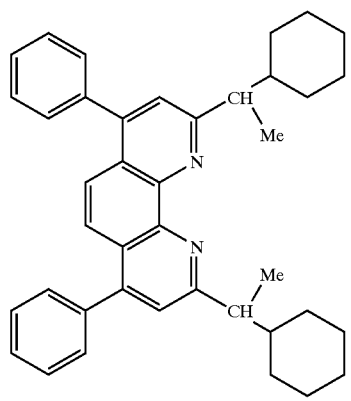
Compound No. 173
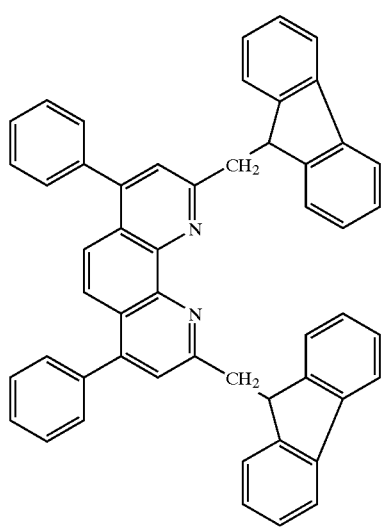
Compound No. 174
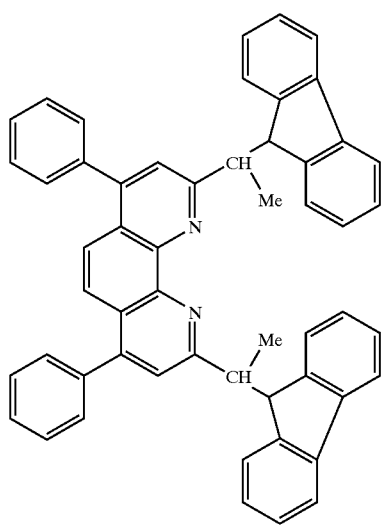
Compound No. 175
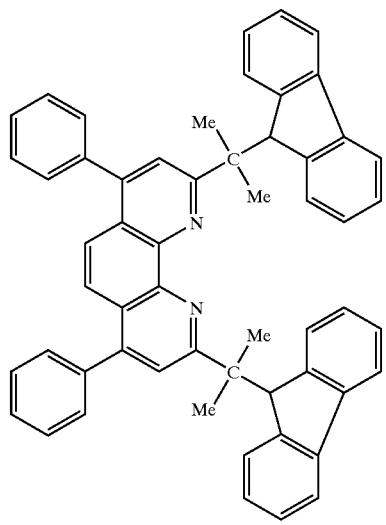
Compound No. 176
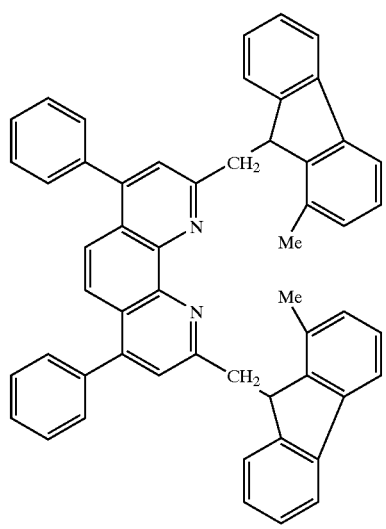
Compound No. 177
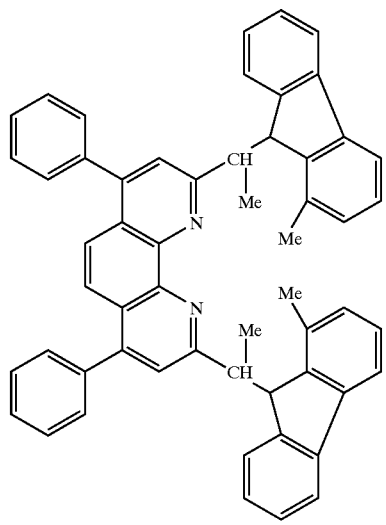

-continued

Compound No. 178

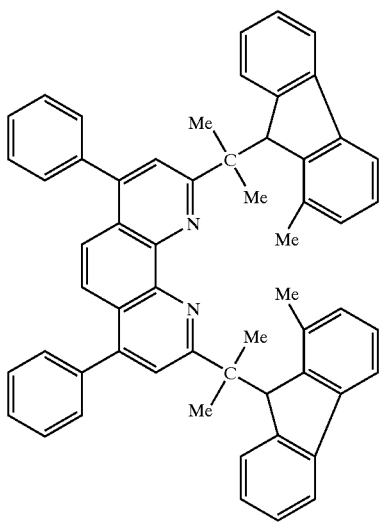

Preferred embodiment of the invention are now described.

First Embodiment

FIG. 1 is a schematic sectional view showing an essential part of an organic EL device capable of emitting blue luminescence according to the first embodiment of the invention.

In this embodiment, a transparent electrode, made of ITO (indium tin oxide) or Zn-doped indium oxide, is formed on a glass substrate 6 by sputtering or vacuum deposition, followed by successively forming a hole transporting luminescent layer 4a, a hole transporting luminescent layer 4b, a hole-blocking layer 33 containing a bathophenanthroline derivative of the afore-indicated general formula, an electron transport layer 2, and a cathode electrode 1 in this order according to a vacuum deposition technique to form an organic electroluminescent device (organic EL device) 21 made of the amorphous organic thin films.

This organic EL device 21 has such an arrangement that the hole transport layer 4 serves also as a luminescent layer, and this fundamental structure is likewise employed in other embodiments described hereinafter.

The feature of the organic EL device 21 of this embodiment resides in that the bathophenanthroline derivative-containing layer 33 is interposed, as a hole-blocking layer, between the hole transport layer 4 and the electron transport layer 2, so that the re-combination of electrons-holes is promoted in the hole transport layer 4, at which luminescence is emitted, and/or luminescence is also obtained from the bathophenanthroline derivative-containing layer 33.

Figure 6:
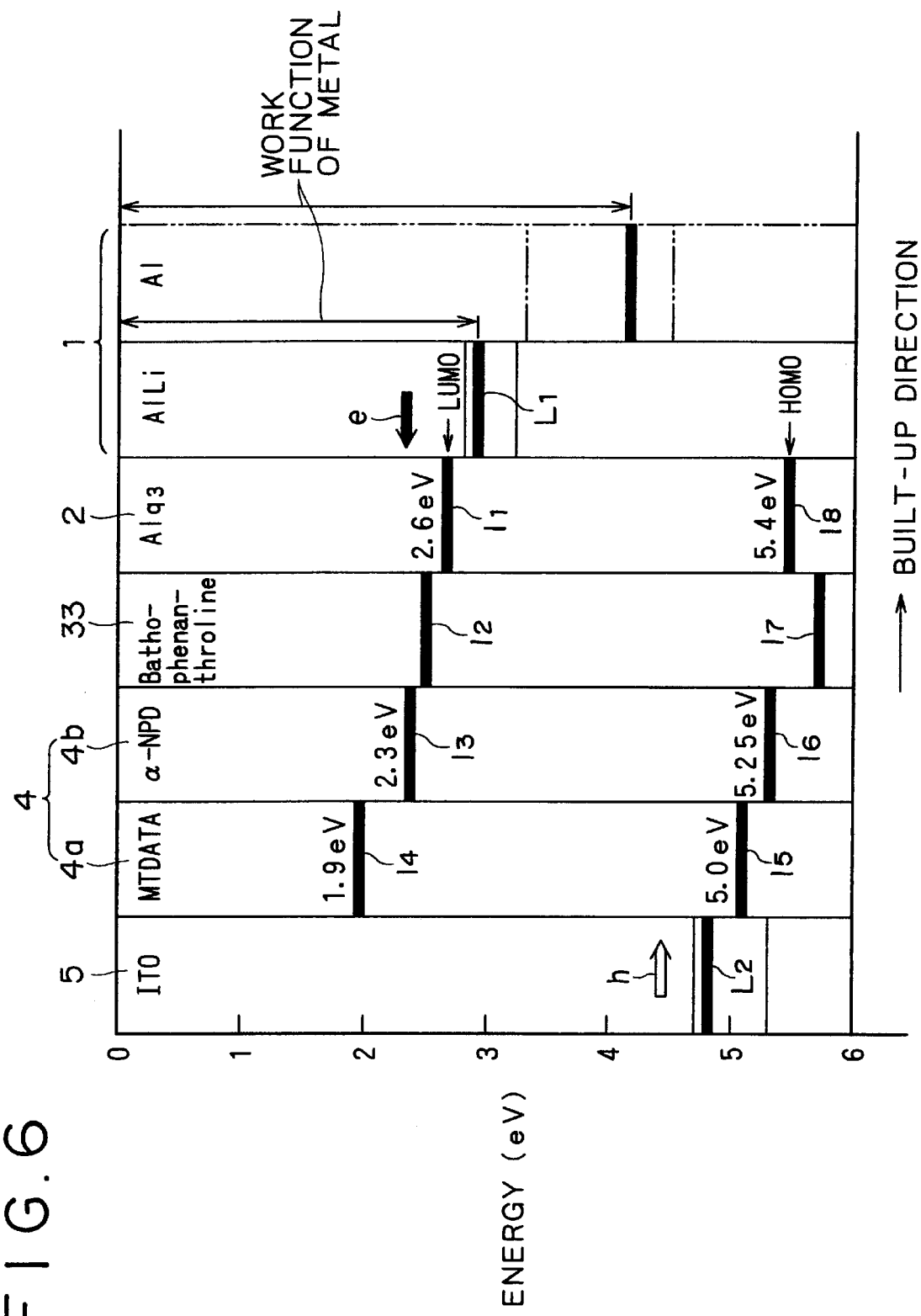
FIG. 6 is a view of a band model schematically showing a built-up structure of the organic EL device of the first embodiment.

FIG. 6 schematically shows the built-up structure of the organic EL device of this embodiment in FIG. 1 as a band model.

In FIG. 6, the thick lines ($L_1$, $L_2$) indicated at the cathode 1 made of Al and Al-Li (aluminium-lithium,) and the ITO transparent electrode 5 layer, respectively, mean approximate work functions of the respective metals. In the respective layers between the electrodes, upper thick lines $l_1$, $l_2$, $l_3$ and $l_4$ and numerical values thereof indicate the lowest unoccupied molecular orbital (LUMO) levels, and lower thick lines $l_5$, $l_6$, $l_7$ and $l_8$ and numerical values thereof indicate the highest occupied molecular orbital (HOMO) levels, respectively. It is to be noted that the energy levels in FIG. 6 are shown only by way of example and may widely vary depending on the types of materials.

In the organic EL device, as shown in FIG. 6, the holes h charged from the transparent electrode 5 serving as an anode are moved via the hole transport layer 4. On the other hand, electrons e charged from the metal electrode 1 serving as a cathode are moved via the electron transport layer 2. The electrons-holes are re-combined in the hole transporting luminescent layer, at which luminescence is emitted.

The electrons e charged from the metal electrode 1 serving as a cathode has the tendency of moving toward a lower energy level, and can arrive at the hole transporting luminescent layers 4b, 4a via the lowest unoccupied molecular orbital (LUMO) levels $l_1$ to $l_4$ of the respective layers in the order of the metal electrode 1, electron transport layer 2, hole-blocking layer 33, hole transporting luminescent layer 4b and hole transporting luminescent layer 4a.

On the other hand, the holes h charged from the ITO transparent electrode 5 serving as an anode has the tendency of moving toward a higher energy level, and can move to the electron transport layer 2 via the highest occupied molecular orbital (HOMO) levels $l_5$ to $l_7$ of the respective layers in the order of the hole transporting luminescent layer 4a, hole transporting luminescent layer 4b and hole-blocking layer 33.

However, as shown in FIG. 6, the highest occupied molecular orbital (HOMO) level $l_8$ of the electron transport layer 2 is lower in energy than the highest occupied molecular orbital (HOMO) level $l_7$ of the hole-blocking layer 33. This makes it difficult that the charged holes h moves from the hole-blocking layer 33 toward the electron transport layer 2, and thus, they are filled in the hole-blocking layer 33.

Eventually, the holes h filled in the hole-blocking layer 33 promote the re-combination of electrons-holes at the hole transport layer 4, thereby permitting the luminescent materials of the hole transporting luminescent layers 4a, 4b of the hole transport layer 4 to emit luminescence or light.

In this way, the provision of the hole-blocking layer 33 effectively controls the transport of the holes h in the hole-blocking layer 33 so that the electron-hole re-combination in the hole transport layer 4 is efficiently caused. Thus, light with a specific wavelength (blue) is emitted in the form of light emission mainly from the hole transporting luminescent layer 4b, adjoining to the hole-blocking layer 33, of the light-emitting hole transporting luminescent layers 4a, 4b, to which emission from the hole transporting luminescent layer 4a is added.

Fundamentally, the electron-hole re-combination takes place in the respective layers including the electron transport layer 2 and the hole transport layer 4 as resulting from the charge of electrons from the cathode electrode 1 and the charge of holes from the anode electrode 5. Accordingly, in the absence of such a hole-blocking layer 33 as set out above, the electron-hole re-combination occurs at the interface between the electron transport layer 2 and the hole transport layer 4 so that light emission with a long wavelength alone is obtained. However, when the hole-blocking layer 33 as in this embodiment is provided, it is enabled to promote blue light emission while permitting the luminescent substance-containing hole transport layer 4 as an emission region.

As set out above, the hole-blocking layer 33 is provided to control the transport of the holes h. To this end, it is sufficient that the highest occupied molecular orbital (HOMO) level of the hole-blocking layer 33 is not higher than the HOMO level that is lower in energy between the HOMO levels of the hole transporting luminescent layer 4b and the electron transport layer 2, and that the lowest unoccupied molecular orbital (LUMO) level of the hole-blocking layer 33 is not lower than the LUMO level that is lower in energy and is not higher than the LUMO level that is higher in energy, between the LUMO levels of the hole transporting luminescent layer 4b and the electron transport layer 2. Thus, the invention is not limited to such an arrangement as set out before.

In the practice of the invention, the energy levels may not always be within such ranges as defined before, and the bathophenanthroline compound-containing layer per se may emit light or luminescence. In addition, the hole-blocking layer may be made of a built-up structure including a plurality of layers.

The hole-blocking layer 33 may be formed of the bathophenanthroline derivative and/or other material, and its thickness may be changed within a range permitting its function to be maintained. More particularly, the thickness is preferably within a range of 1 Å to 1,000 Å (0.1 nm to 100 nm). If the thickness is too small, the hole blocking ability becomes incomplete, so that the re-combination region is liable to extend over the hole transport layer and the electron transport layer. On the contrary, when the thickness is too large, light emission may not occur due to the increase in film resistance.

Figure 7:
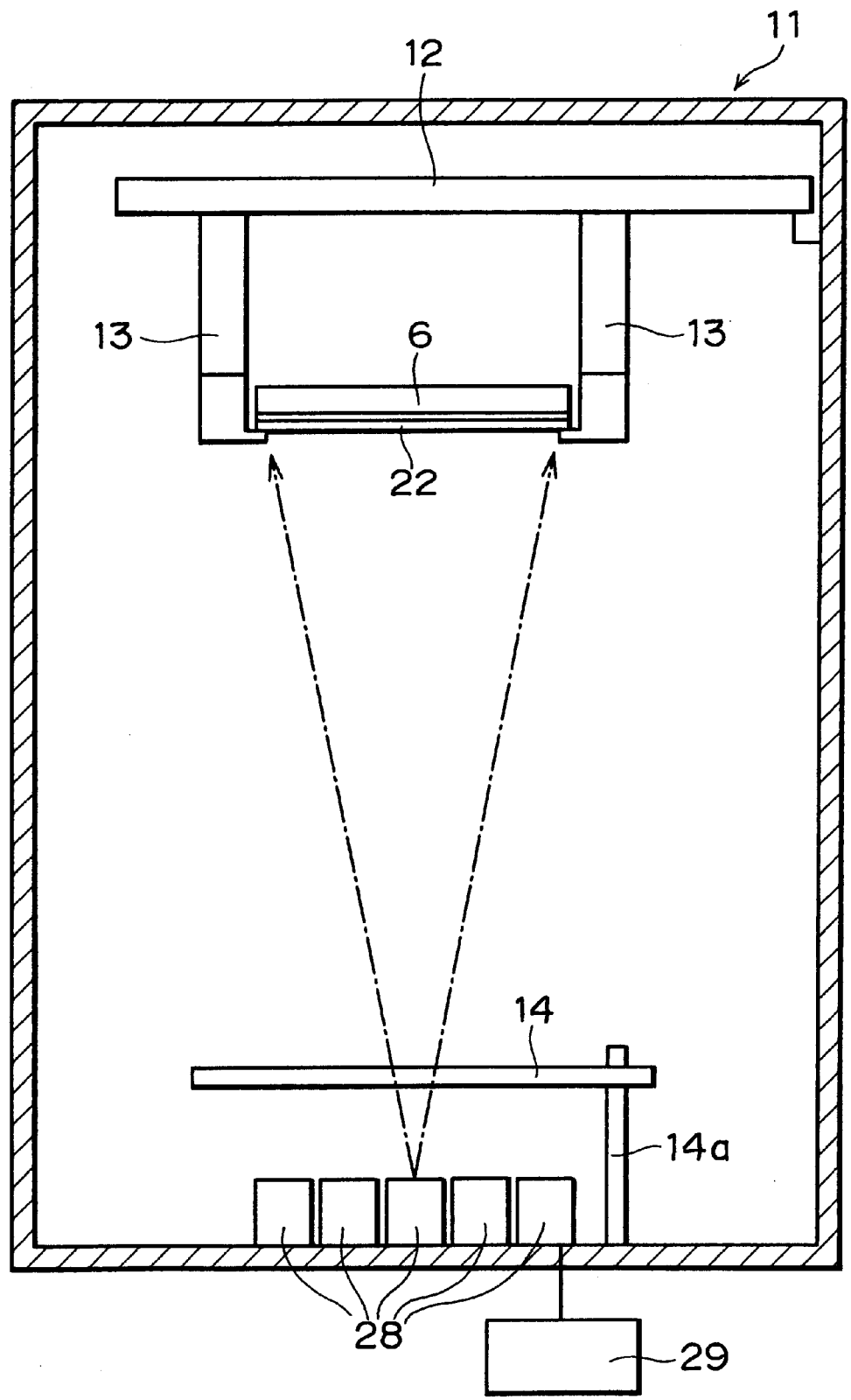
FIG. 7 is a schematic sectional view showing a vacuum deposition apparatus used in the first embodiment.

The organic EL device 21 is made by use of a vacuum deposition apparatus 11 shown in FIG. 7. The apparatus 11 has therein a pair of support means 13 fixed below an arm 12. A stage mechanism (not shown) is provided between the fixed support means 13 so that a transparent glass substrate 6 can be turned down and a mask 22 can be set as shown. Below the glass substrate 6 and the mask 22, a shutter 14 supported with a shaft 14a is provided, below which a given number of deposition sources 28 are further provided. The deposition sources are heated by means of a resistance heating system using an electric power supply 29. For the heating, an EB (electron beam) heating system may also be used, if necessary.

In this apparatus, the mask 22 is for pixels, and the shutter 14 is for deposition materials. The shutter 14 is able to rotate about the shaft 14a and has the function of intercepting a deposition stream of a material depending on the sublimation temperature of the deposition material.

Figure 8:
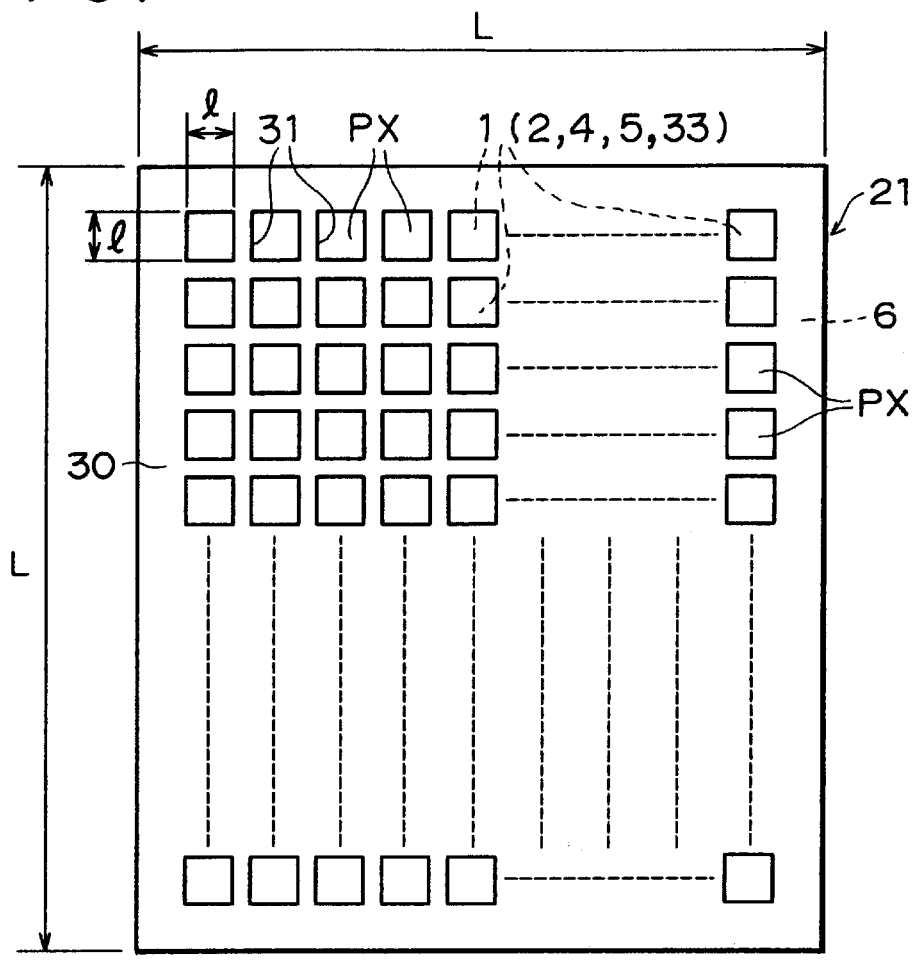
FIG. 8 is a plan view showing the organic EL device of the embodiment.

FIG. 8 is a plan view showing a specific example of the organic EL device fabricated by use of the vacuum deposition apparatus. More particularly, ITO transparent electrodes 5 each with a size of 2 mm×2 mm are vacuum deposited on a glass substrate 6 with a size, L, of 30 mm×30 mm by means of the vacuum deposition apparatus in a thickness of about 100 nm, followed by vacuum deposition of $SiO_2$ 30 over the entire surface thereof and etching in a given pixel pattern to form a multitude of openings 31. In this way, the transparent electrodes 5 are, respectively, exposed. Thereafter, the respective organic layers 4, 33, 2 and a metal electrode 1 are successively formed through a deposition mask 22 of $SiO_2$ on each 2 mm×2 mm emission region (pixel) PX.

Using the vacuum deposition apparatus 11, a large-sized pixel may be singly formed, aside from the device having a multitude of pixels as shown in FIG. 8.

In this way, when the organic layer 33 is formed in order to improve the efficiency of the electron-hole re-combinations in the emission region, there can be obtained an organic EL device that is stable and high in brightness, can be driven at a low voltage and has the hole transporting luminescent layer 4. As will be described in more detail, it is enabled to obtain a brightness of not smaller than 10,000 $cd/m^2$ by DC drive and a peak brightness, calculated as DC, of not smaller than 55,000 $cd/m^2$ by pulse drive at a duty ratio of $1/10$ with respect to blue light emission.

The transparent electrode, organic hole transport layer, organic hole-blocking layer, organic electron transport layer and metal electrode of the electroluminescent device may, respectively, have a built-up structure made of a plurality of layers.

The respective organic layers of the electroluminescent device may be formed not only by vacuum deposition, but also other film-forming techniques using sublimation or vaporization, or a technique of spin coating, casting or the like.

The hole transporting luminescent layer of the electroluminescent device may be formed by co-deposition of a small amount of molecules in order to control emission spectra of the device, and may be, for example, an organic thin film containing a small amount of an organic substance such as a perylene derivative, a coumarin derivative or the like.

Usable hole transport materials include, aside from benzidine or its derivatives, styrylamine or its derivatives and triphenylmethane or its derivatives, porphyrin or its derivatives, triazole or its derivatives, imidazole or its derivatives, oxadiazole or its derivatives, polyarylalkanes or derivatives thereof, phenylenediamine or its derivatives, arylamines or derivatives thereof, oxazole or its derivatives, anthracene or its derivatives, fluorenone or its derivatives, hydrazone or its derivatives, stilbene or its derivatives, or heterocyclic conjugated monomers, oligomers, polymers and the like such as polysilane compounds, vinylcarbazole compounds, thiophene compounds, aniline compounds and the like.

More particularly, mention is made of α-naphthylphenyldiamine, porphyrin, metal tetraphenylporphyrins, metal naphthalocyanines, 4,4',4"-trimethyltriphenylamine, 4,4',4"-tris(3-methylphenylphenylamino)triphenylamine, N,N,N',N'-tetrakis(p-tolyl)-p-phenylenediamine, N,N,N',N'-tetraphenyl-4,4'-diaminobiphenyl, N-phenylcarbazole, 4-di-p-tolylaminostilbene, poly(paraphenylenevinylene), poly (thiophenevinylene), poly(2,2'-thienylpyrrole) and the like, although not limited thereto.

Usable electron transport materials include quinoline or its derivatives, perylene or its derivatives, bistylyl or its derivatives, pyrazine or its derivatives, and the like.

More specifically, mention is made, for example, of 8-hydroxyquinoline aluminium, anthracene, naphthalene, phenanthrene, pyrene, chrysene, perylene, butadiene, coumarin, acridine, stilbene, or derivatives thereof.

The materials used as the anode electrode or cathode electrode of the electroluminescent device are not limitative in types.

The cathode electrode material should preferably be made of a metal whose work function from a vacuum level of an electrode material is small in order to efficiently charge electrons. There may be used, aside from an aluminium-lithium alloy, low work function metals such as, for example, aluminium, indium, magnesium, silver, calcium, barium, lithium and the like, singly or in the form of alloys with other metals for enhancing the stability thereof.

In order to take out organic electroluminescence from the side of the anode electrode, ITO is used as a transparent anode electrode in examples appearing hereinafter. Nevertheless, there may be used electrode materials, which have a great work function from the vacuum level of an anode electrode material and include, for example, gold, a stannic oxide-antimony mixture, a zinc oxide-aluminium mixture or the like, so as to efficiently charge holes.

The substrate 2 may not be limited to a glass substrate, but may be made of an opaque material. More particularly, there may be used, for example, a silicon substrate, a Cr substrate, or a substrate made of glass, on which a metal is formed by vacuum deposition. Where a substrate made of an opaque material is used, it is preferred that the upper surface of an organic EL device (i.e. the side of the cathode electrode) is formed of a transparent or translucent material so that electroluminescence is picked out to outside. ITO may be used for this purpose, for example.

There can be made an organic electroluminescent device for full color or multi-color, which is capable of emission of primaries of R, G and B, by proper choice of luminescent materials, not to mention an organic electroluminescent device for monochrome. Besides, the organic electroluminescent device of the invention is usable not only for display, but also for light source along with its application to other optical use.

It will be noted that the organic electroluminescent device may be sealed with germanium oxide or the like so as to enhance the stability thereof by suppressing the influence of oxygen or the like in air, or may be driven under conditions drawn to vacuum.

Second Embodiment

Figure 9:
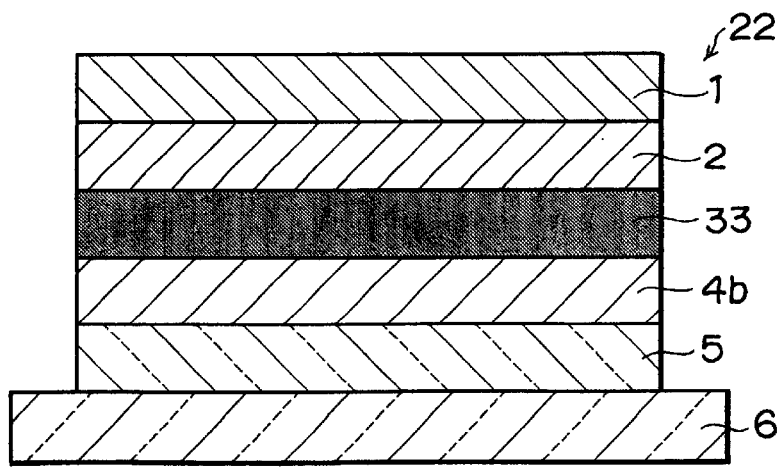
FIG. 9 is a schematic sectional view showing an essential part of an organic EL device according to a second embodiment of the invention.

FIG. 9 is a schematic sectional view showing an essential part of an organic EL device according to a second embodiment of the invention. An organic EL device 22 of this embodiment differs from that of FIG. 1 in that the hole transporting luminescent layer 4b is formed on the ITO transparent electrode 5 so that the hole transporting luminescent layer is formed as a single layer.

Third Embodiment

Figure 10:
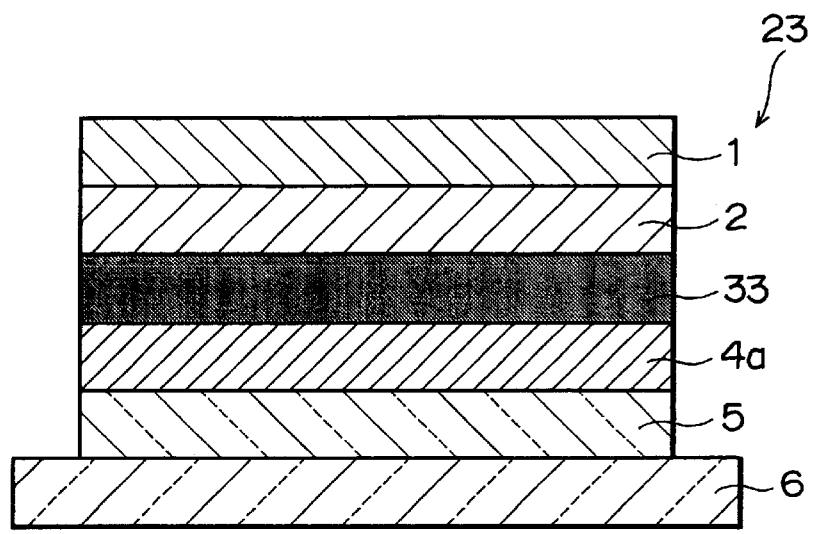
FIG. 10 is a schematic sectional view showing an essential part of an organic EL device according to a third embodiment of the invention.

FIG. 10 is a schematic sectional view showing an essential part of an organic electroluminescent device according to a third embodiment of the invention.

An organic EL device 23 of this embodiment differs from that of FIG. 1 in that a hole transport layer (serving also as a hole transporting luminescent layer) 4a is formed on the ITO transparent electrode 5, and thus, the hole transporting luminescent layer is formed as a single layer, like the second embodiment.

The invention is described in more detail by way of examples.

Example 1

The specific arrangement of an organic electroluminescent device 21 in this example is described based on the fabrication method thereof.

Figure 11:
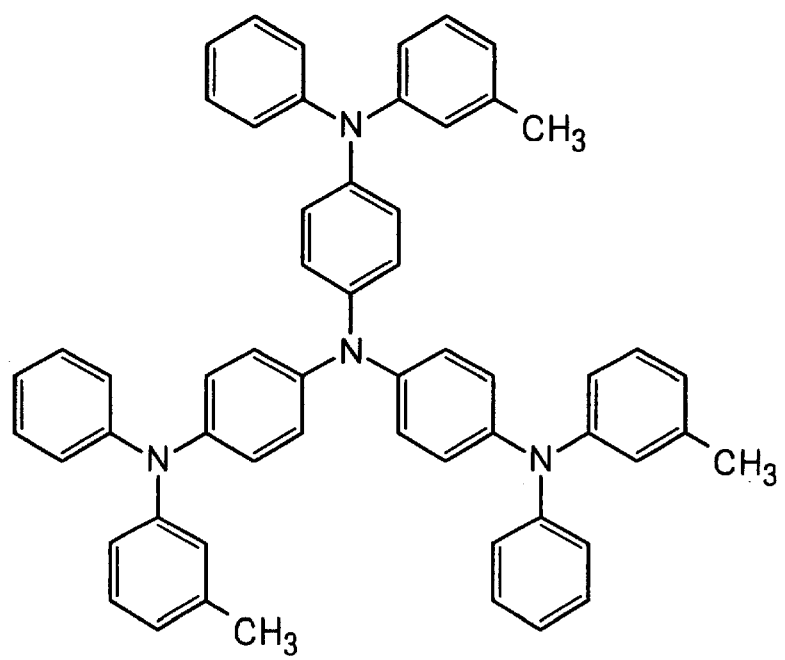
FIG. 11 is a view showing a structural formula of m-MTDATA (i.e. a hole transporting luminescent material) used in the third embodiment.

An ITO transparent electrode 5 having a film thickness, for example, of about 100 nm was formed on a 30 mm×30 mm glass substrate 6, followed by masking regions other than 2 mm×2 mm emission regions by deposition of $SiO_2$ to obtain a cell for making an organic electroluminescent device.

m-MTDATA (4,4',4"-tris(3-methylphenylphenylamino)-triphenylamine of the structural formula indicated in FIG. 11) was deposited on the ITO transparent electrode 5, as a hole transporting luminescent layer 4a, at a deposition rate of 0.2 to 0.4 nm/second in vacuum in a thickness of 30 nm according to a vacuum deposition method.

Figure 12:
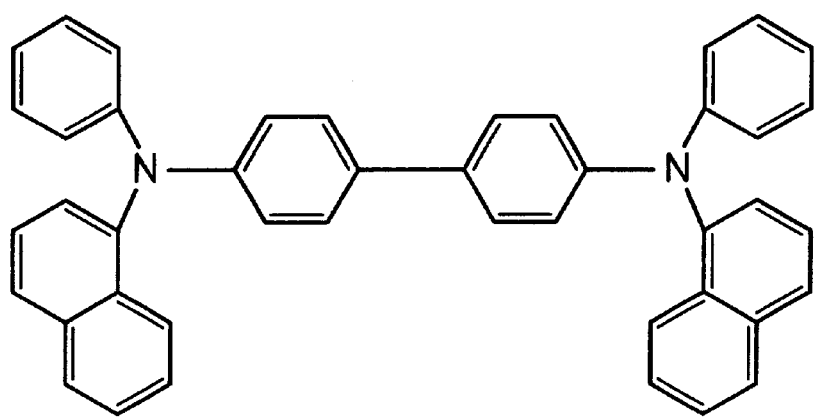
FIG. 12 is a view showing a structural formula of α-NPD (i.e. a hole transporting luminescent material) used in the third embodiment.

Next, α-NPD (α-naphthylphenyldiamine of the structural formula indicated in FIG. 12) was formed on the hole transporting luminescent layer 4a, as a hole transporting luminescent layer 4b, by vacuum deposition (deposition rate: 0.2 to 0.4 nm/second) in a thickness of 53 nm, thereby forming a luminous hole transport layer 4 having a double-layered structure.

Figure 2:
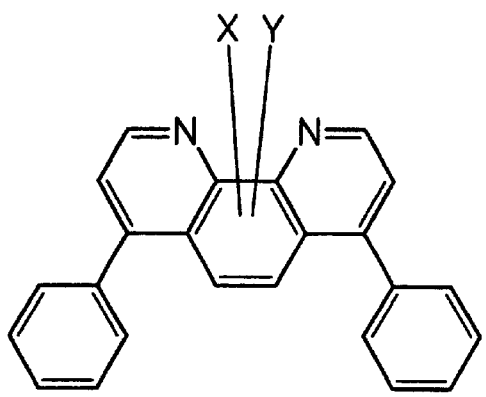
FIG. 2 is a view showing the general formula of a bathophenanthroline derivative usable in a hole-blocking layer of the organic EL device.
Figure 4:
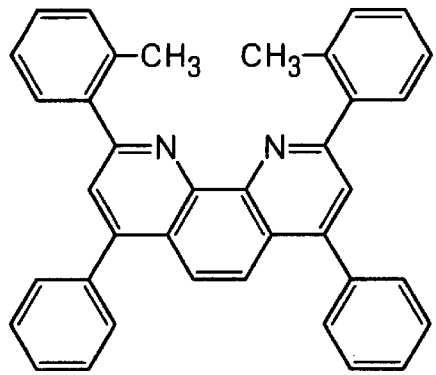
FIG. 4 is a view showing structural formula 2 of a bathophenanthroline derivative usable in the hole-blocking layer.

Thereafter, a bathophenanthroline derivative of the general formula indicated in FIG. 2, e.g. an o-methylphenyl-bathophenanthroline (i.e. a bathophenanthroline derivative (of the structural formula 2 indicated in FIG. 4 (Compound No. 29) attached with a methylphenyl group at the 2 and 9 positions of 2,9-dimethyl-4,7-diphenyl-1,10-phenanthroline) was vacuum-deposited on the hole transport layer 4, as a hole-blocking layer 33, in a thickness of 15 nm (deposition rate: 0.2 to 0.4 nm/second).

Figure 13:
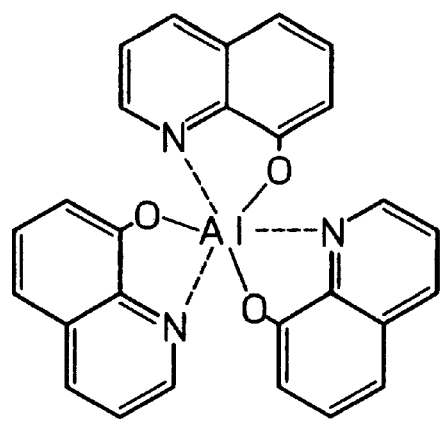
FIG. 13 is a view showing a structural formula of Alq$_3$ (i.e. an electron transport material) used in the third embodiment.
Figure 14:
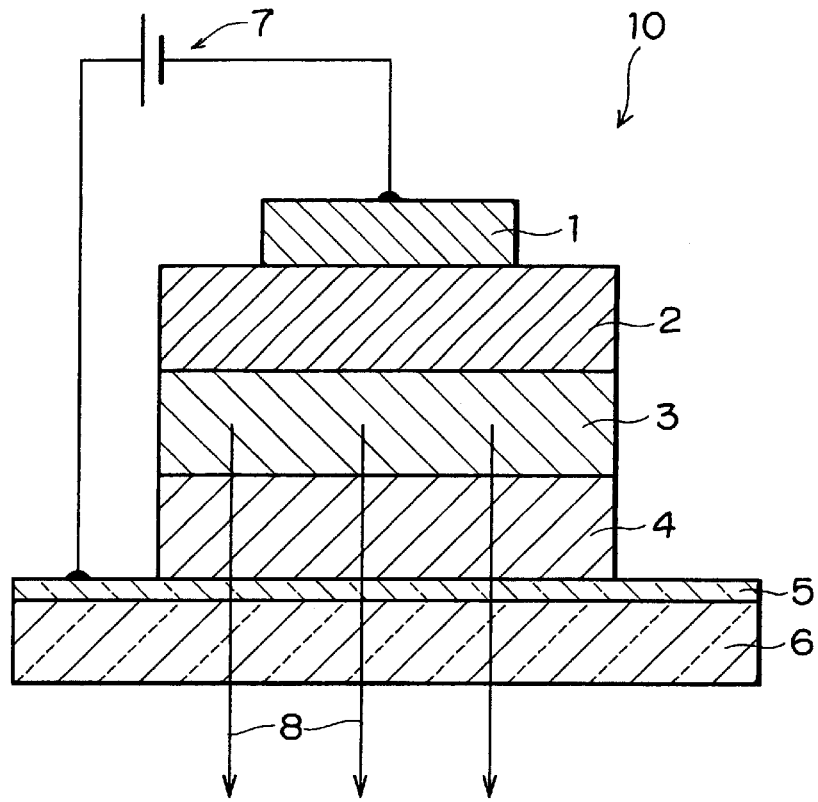
FIG. 14 is a schematic sectional view showing an example of a prior-art organic EL device.
Figure 15:
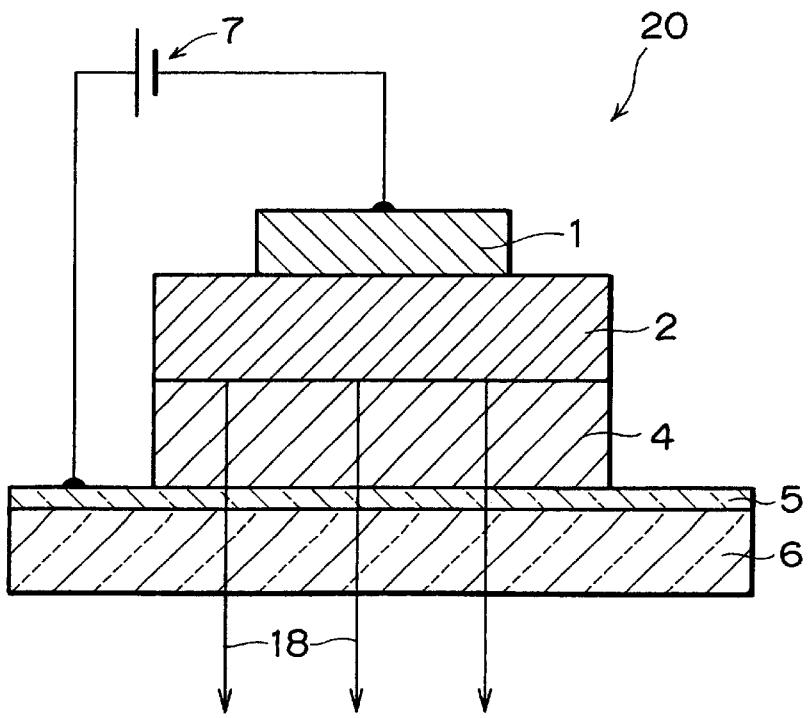
FIG. 15 is a schematic sectional view showing an example of another type of prior-art organic EL device.

Subsequently, $Alq_3$ (8-hyroxyquinoline aluminium of the structural formula indicated in FIG. 13) serving as an electron transport layer 2 was deposited on the hole-blocking layer 33 in a thickness of 20 nm, followed by vacuum deposition of Al-Li (aluminium-lithium alloy with a Li concentration of about 1 mol %) in a thickness of about 0.5 nm and Al in a thickness of 200 nm as a cathode electrode 1, thereby obtaining a blue-emitting organic EL device 21 shown in FIG. 1.

The characteristic properties of the organic EL device made in this example were measured, revealing that the maximum emission wavelength (absorption peak) was at about 450 nm and the coordinates on the CIE chromaticity coordinates were at (0.15, 0.16). Thus, a good blue emission was obtained.

It was apparent from the shape of emission spectra that the emission resulted from the hole transporting luminescent layer 4b (see FIG. 1) made of α-NPD.

Example 2

The organic EL device of Example 2 is described on the basis of its fabrication method.

With the organic EL device 23 of this example, an about 100 nm thick ITO transparent electrode 5 was initially formed on a 30 mm×30 mm glass substrate, followed by masking regions other than 2 mm×2 mm emission regions by vacuum deposition of $SiO_2$ to obtain a cell for making an organic electroluminescent device.

m-MTDATA (4,4',4"-tris(3-methylphenylphenylamino)-triphenylamine of the structural formula indicated in FIG. 11) was deposited on the ITO transparent electrode 5, as a hole transporting luminescent layer 4a, in vacuum in a thickness of 50 nm (deposition rate of 0.2 to 0.4 nm/second) according to a vacuum deposition method, thereby forming the hole transporting luminescent layer as a single layer.

Figure 3:
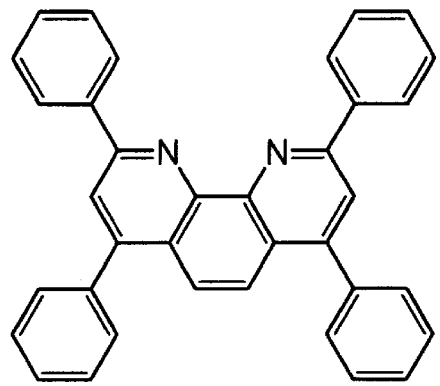
FIG. 3 is a view showing structural formula 1 of a bathophenanthroline derivative usable in the hole-blocking layer.

Next, phenylbathophenanthroline of the formula indicated in FIG. 3 (i.e. a phenanthroline derivative attached with a phenyl group at the 2 and 9 positions of 2,9-dimethyl-4,7-diphenyl-1,10-phenanthroline) was vacuum-deposited, as a hole-blocking layer 33, in a thickness, for example, of 20 nm (deposition rate of 0.2 to 0.4 nm/second)

Subsequently, $Alq_3$ (8-hyroxyquinoline aluminium of the structural formula indicated in FIG. 13) serving as an electron transport layer 2 was deposited in a thickness of 30 nm, followed by vacuum deposition of Al-Li (aluminium-lithium alloy with a Li concentration of about 1 mol %) in a thickness of about 200 nm as a cathode electrode 1, thereby obtaining an organic EL device 23 shown in FIG. 10.

The characteristic properties of the organic EL device made in this example were measured, revealing that the maximum emission wavelength (absorption peak) was at 500 nm and the coordinates on the CIE chromaticity coordinates were at (0.22, 0.35). Thus, a good blue emission was obtained.

The brightness at a current density of 100 mA/cm$^2$ was at 2,200 cd/m$^2$.

Example 3

The organic EL device of Example 3 was described based on its fabrication method.

For making an organic EL device 23 of this example, an ITO transparent electrode 5 was formed on a 30 mm×30 mm glass substrate 6 in a thickness, for example, of about 100 nm, followed by masking regions other than 2 mm×2 mm emission regions by vacuum deposition of SiO$_2$ to obtain a cell used to make an organic electroluminescent device.

m-MTDATA (4,4',4"-tris(3-methylphenylphenylamino)-triphenylamine of the structural formula indicated in FIG. 11) was deposited on the ITO transparent electrode 5, as a hole transporting luminescent layer 4a, in vacuum in a thickness of 50 nm (deposition rate: 0.2 to 0.4 nm/second) according to a vacuum deposition method, thereby forming the hole transporting luminescent layer as a single layer.

Next, methylphenylbathophenanthroline of the structural formula 2 indicated in FIG. 4 (Compound No. 29) (i.e. a phenanthroline derivative attached with an o-methylphenyl group at the 2 and 9 positions of 2,9-dimethyl-4,7-diphenyl-1,10-phenanthroline) was vacuum-deposited, as a hole-blocking layer 33, in a thickness, for example, of 20 nm (deposition rate: 0.2 to 0.4 nm/second).

Subsequently, Alq$_3$ (8-hyroxyquinoline aluminium of the structural formula indicated in FIG. 13) serving as an electron transport layer 2 was deposited in a thickness of 30 nm, followed by vacuum deposition of Al-Li (aluminium-lithium alloy with a Li concentration of about 1 mol %) in a thickness of about 200 nm as a cathode electrode 1, thereby obtaining an organic EL device 23 shown in FIG. 10.

The characteristic properties of the organic EL device made in this example were measured, revealing that the maximum emission wavelength (absorption peak) was at 450 nm and the coordinates on the CIE chromaticity coordinates were at (0.17, 0.15). Thus, a good blue emission was obtained.

The brightness at a current density of 100 mA/cm$^2$ was at 1,100 cd/m$^2$.

Example 4

The organic EL device of Example 4 is described on the basis of its fabrication method.

With the organic EL device 23 of this example, an about 100 nm thick ITO transparent electrode 5 was initially formed on a 30 mm×30 mm glass substrate 6, followed by masking regions other than 2 mm×2 mm emission regions by vacuum deposition of SiO$_2$ to obtain a cell for making an organic electroluminescent device.

m-MTDATA (4,4',4"-tris(3-methylphenylphenylamino)-triphenylamine of the structural formula indicated in FIG. 11) was deposited on the ITO transparent electrode 5, as a hole transporting luminescent layer 4a, in vacuum in a thickness of 50 nm (deposition rate of 0.2 to 0.4 nm/second) according to a vacuum deposition method, thereby forming the hole transporting luminescent layer as a single layer.

Figure 5:
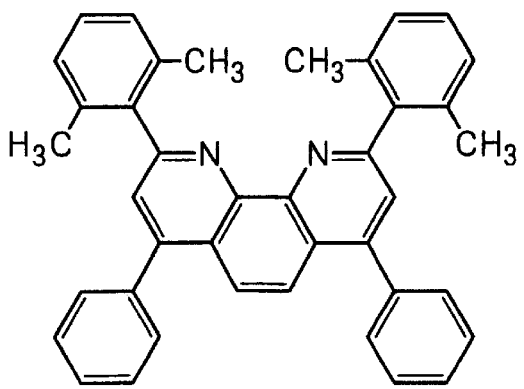
FIG. 5 is a view showing structural formula 3 of a bathophenanthroline derivative usable in the hole-blocking layer.

Next, dimethylphenylbathophenanthroline of the structural formula 3 indicated in FIG. 5 (i.e. a phenanthroline derivative attached with an o-dimethylphenyl group at the 2 and 9 positions of 2,9-dimethyl-4,7-diphenyl-1,10-phenanthroline) was vacuum-deposited, as a hole-blocking layer 33, in a thickness, for example, of 20 nm (deposition rate of 0.2 to 0.4 nm/second).

Subsequently, Alq$_3$ (8-hyroxyquinoline aluminium of the structural formula indicated in FIG. 13) serving as an electron transport layer 2 was deposited in a thickness of 30 nm, followed by vacuum deposition of Al-Li (aluminium-lithium alloy with a Li concentration of about 1 mol %) in a thickness of about 200 nm as a cathode electrode 1, thereby obtaining an organic EL device 23 shown in FIG. 10.

The characteristic properties of the organic EL device made in this example were measured, revealing that the maximum emission wavelength (absorption peak) was at 440 nm and the coordinates on the CIE chromaticity coordinates were at (0.16, 0.15). Thus, a good blue emission was obtained.

The brightness at a current density of 100 mA/cm$^2$ was at 1,030 cd/m$^2$.

As will be apparent from the above examples, the organic EL devices obtained in Examples 1 to 4 of the invention, respectively, have the bathophenanthroline derivative-containing hole-blocking layer 33 interposed between the hole transporting luminescent layer 4a and/or 4b and the electron transport 2. Accordingly, the electron-hole re-combination in the hole transport layer becomes satisfactory and can serve as a luminescent layer, thereby ensuring stable emission in a high efficiency.

Not only blue emission, but also bluish green emission was possible, along with red emission through doping and control in chromaticity by doping.

As will be apparent from these examples, even though existing materials are used, an organic EL device that has excellent chromaticity and ensures blue emission in high brightness can be made. Thus, a great possibility and shortage in time can be realized with respect to the development of materials for the device. In addition, it is believed that these examples indicate indices to the design of novel luminescent materials and electron transport materials.

Once again, in the practice of the invention, a bathophenanthroline derivative of the afore-indicated general formula is contained in a portion contacting a main emission region (especially, a bathophenanthroline derivative-containing hole-blocking layer is interposed between a hole transporting luminescent layer and an electron transport layer). Accordingly, using an organic electroluminescent device comprising a hole transport layer serving as a luminescent layer that has been considered difficult in realizing such an arrangement due to the absence of non-luminescent, excellent electron transport materials, stable emission of a high brightness can be obtained in a high efficiency. This is particularly remarkable with respect to blue emission, and it is possible to obtain a peak brightness of not lower than 10,000 cd/m$^2$ by DC drive and a peak brightness of not lower than 55,000 cd/m$^2$, calculated as DC, by pulse drive at a duty ratio of 1/100.

What is claimed is:

1. An organic electroluminescent device of the type which comprises a multilaminated structure made of an organic compound including an emission region made of an organic compound, wherein a portion contacting the emission region contains a bathophenanthroline derivative of the formula:

Formula:

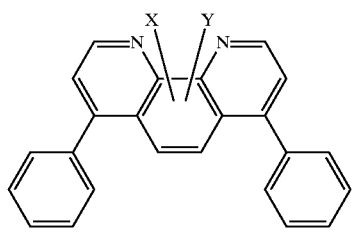

wherein X and Y may be the same or different and independently represent a hydrogen atom except the case where a hydrogen atom is at the 2 and 9 position, a substituted or unsubstituted alkyl group except the case where a methyl group is at the 2 and 9 position, a substituted or unsubstituted cycloalkyl group, a substituted or unsubstituted aryl group, a substituted or unsubstituted amino group, a halogen atom, a nitro group, a cyano group or a hydroxyl group provided that at least one of these groups is contained at a preselected position;

wherein emission is obtained through re-combination of electrons and holes in a hole transport organic material and wherein in order to cause the re-combination in a hole transport layer consisting of at least one organic hole transporting luminescent layer, there is provided a hole-blocking layer containing the bathophenanthroline derivative; and wherein the hole-blocking layer is provided between the hole transport layer and an electron transport layer in the multilaminated structure.

2. An organic electroluminescent device according to claim 1, wherein emission is obtained through re-combination of electrons and holes in a hole transport organic material.

3. An organic electroluminescent device according to claim 1, wherein the hole-blocking layer has a highest occupied molecular orbital (HOMO) level not higher than a highest occupied molecular orbital (HOMO) level that is lower in energy between the highest occupied molecular orbital levels of the respective organic layers built-up in contact with opposite sides of the hole-blocking layer.

4. An organic electroluminescent device according to claim 1, wherein the hole-blocking layer has a lowest unoccupied molecular orbital (LUMO) level not lower than a lowest unoccupied molecular orbital (LUMO) level that is lower in energy between the lowest unoccupied molecular orbital levels of the respective organic layers built-up in contact with opposite sides of the hole-blocking layer and is not higher than the other higher lowest unoccupied molecular orbital (LUMO) level.

5. An organic electroluminescent device according to claim 1, wherein the bathophenanthroline derivative functions as a luminescent material.

6. An organic electroluminescent device according to claim 1, wherein the device comprises, on an optically transparent substrate, a transparent electrode, the multilaminated structure and a metal electrode superposed in this order.

7. An organic electroluminescent device according to claim 6, wherein the device is arranged for a color display.

* * * * *